United States Patent
Naganuma

(10) Patent No.: US 7,502,397 B2
(45) Date of Patent: Mar. 10, 2009

(54) SEMICONDUCTOR LASER ASSEMBLY

(75) Inventor: Kaori Naganuma, Kanagawa (JP)

(73) Assignee: Sony Corporation, Tokyo (JP)

( * ) Notice: Subject to any disclaimer, the term of this patent is extended or adjusted under 35 U.S.C. 154(b) by 349 days.

(21) Appl. No.: 10/505,720

(22) PCT Filed: Dec. 26, 2003

(86) PCT No.: PCT/JP03/16946

§ 371 (c)(1),
(2), (4) Date: Aug. 25, 2004

(87) PCT Pub. No.: WO2004/077630

PCT Pub. Date: Sep. 10, 2004

(65) Prior Publication Data

US 2005/0094687 A1    May 5, 2005

(30) Foreign Application Priority Data

Dec. 26, 2002 (JP) ............................. 2002-376591
Jun. 9, 2003 (JP) ............................. 2003-163383

(51) Int. Cl.
*H01S 3/04* (2006.01)
(52) U.S. Cl. ........................................ 372/36; 438/118
(58) Field of Classification Search ................... 372/36, 372/34; 438/118; 428/614; 257/737, 779
See application file for complete search history.

(56) References Cited

U.S. PATENT DOCUMENTS 6,409,072 B1 * 6/2002 Breuer et al. ............ 228/111.5
6,489,677 B2 * 12/2002 Okada et al. ................ 257/712
6,670,222 B1 * 12/2003 Brodsky ...................... 438/118

(Continued)

FOREIGN PATENT DOCUMENTS

DE          197 01 680 A1      7/1998

(Continued)

*Primary Examiner*—Minsun Harvey
*Assistant Examiner*—Tuan N. Nguyen
(74) *Attorney, Agent, or Firm*—Sonnenschein Nath & Rosenthal LLP

(57) ABSTRACT

When a laser diode assembly is manufactured, bulb-shaped solder residue is not formed on a laser diode device, a submount, or a heatsink.

A laser diode assembly (30) comprises a laser diode device (12). A submount (16) is jointed on a substrate side of the laser diode device (12) with a first solder layer (14) in between. A heatsink (20) is jointed on a rear face side of the submount (16) with a second solder layer (18) in between. The submount (16) is provided with a submount groove (32) formed along border of a joint area jointed with the laser diode device (12) and an extension groove (36) extending to edges of the submount (16). Several submount thin grooves (38) whose width is smaller and depth is shallower than of the submount groove (32) are formed in the joint area of the submount in the shape of lattice and in the direction diagonally to the submount groove (32) so that the submount thin grooves (38) are spaced from each other and at least one ends of the submount thin grooves (38) contact with the submount groove (32). When solder joint of the laser diode device (12) is performed, excessive solder flows into the submount groove (32) through the submount thin grooves (38). The submount groove (32) functions as a solder pool for the excessive solder, and the excessive solder is drained outside through the extension groove (36).

6 Claims, 18 Drawing Sheets

U.S. PATENT DOCUMENTS

| | | |
|---|---|---|
| 2001/0048698 A1 | 12/2001 | Lorenzen et al. |
| 2001/0048705 A1 | 12/2001 | Kitaoka et al. |
| 2002/0027231 A1 | 3/2002 | Okada et al. |

FOREIGN PATENT DOCUMENTS

| | | | |
|---|---|---|---|
| EP | 1 154 476 | | 11/2001 |
| JP | 01-127275 | * | 8/1989 |
| JP | 03-217065 | | 9/1991 |
| JP | 04-99858 | | 8/1992 |
| JP | 04-352377 | * | 12/1992 |
| JP | 05-25756 | * | 4/1993 |
| JP | 07-038208 | * | 2/1995 |
| JP | 07-038208 | * | 7/1995 |
| JP | 2001-298237 | | 10/2001 |

* cited by examiner

SEMICONDUCTOR LASER ASSEMBLY

BACKGROUND OF THE INVENTION

The present invention relates to a laser diode assembly having a structure wherein a laser diode device is jointed to a heatsink with a submount in between or directly.

More specifically, the invention relates to a laser diode assembly comprising a construction wherein in assembly, solder overflow from a solder joint face between a laser diode device and a submount or a heatsink is inhibited, and overflowing solder does not form bulb-shaped solder residue on the laser diode device, the submount, or the heatsink.

In a laser diode device, when electrical energy is converted to optical energy, energy loss is generated, and such energy loss is converted to heat energy. This heat energy raises temperature of the laser diode device, and has an unfavorable effect on laser characteristics.

In order to immediately diffuse such heat energy generated in the laser diode device, and reinforce mechanical strength of the laser diode device, generally, a so-called laser diode assembly, wherein a substrate side of a laser diode device is jointed to a heatsink directly or with a submount in between through a solder layer is manufactured as a product.

Specifically, as shown in FIG. 7, in a conventional laser diode assembly 10, a laser diode device 12 is jointed to a submount 16 through a first solder layer 14, and the submount 16 is jointed to a heatsink 20 through a second solder layer 18. The laser diode device 12 comprises a lamination structure including a light-emitting layer on a semiconductor substrate. There is a structure wherein the laser diode 12 is directly jointed to the heatsink 20 without the submount 16.

The heatsink 20 is provided with an electrode pad 24 with an insulating plate 22 in between. The electrode pad 24 and an electrode of the laser diode device 12 are connected (wire bonded) through a wire 26. That is, the laser diode device 12 is connected to outer equipment through the electrode pad 24.

The laser diode device 12 is, for example, a GaAs edge-emitting type laser diode device formed on a GaAs substrate. In FIG. 7, an end face opposite of the electrode pad 24 side is an emitting end face. Number of the laser diode device 12 can be one as shown in FIG. 7 or plural. Some of the laser diode device 12 are arranged in the shape of an array.

The submount 16 is a part to reinforce mechanical strength of the laser diode device 12 and is a metal plate made of, for example, silicon carbide (SiC) or an alloy of copper (Cu) and tungsten (W). The heatsink 20 is often made of a copper plate.

The first solder layer 14 to joint the laser diode device 12 and the submount 16 is, for example, a gold-tin (Au/Sn) solder layer. The second solder layer 18 to joint the submount 16 and the heatsink 20 is, for example, an indium (In) solder layer.

When such a laser diode assembly 10 is fabricated, first, the submount 16 which lays the laser diode device 12 on a gold-tin solder plating layer formed on a joint face of the submount 16 is forwarded into a reflow oven, and heated to a melting temperature of the gold-tin solder or higher, for example, 300° C. to melt the gold-tin solder plating layer.

Next, the submount 16 placing the laser diode device 12 is taken out from the reflow oven, and cooled. The melted gold-tin solder plating layer is thereby solidified to become the first solder layer 14, and the submount 16 and the laser diode device 12 are jointed.

Subsequently, indium metal vapor is deposited on a joint face of the heatsink 20 to obtain an indium deposition layer. The submount 16 to which the laser diode device 12 is jointed is laid on the indium deposition layer. Then, the resultant is forwarded into the reflow oven, heated to 156° C. or higher which is a melting temperature of the indium solder, for example, 180° C. to melt the indium deposition layer. Next, the heatsink 20 placing the submount 16 is taken out from the reflow oven and cooled. The melted indium deposition layer is thereby solidified to become the second solder layer 18, and the heatsink 20 and the submount 16 are jointed.

In the conventional laser diode assembly 10, there is an example wherein the second solder layer 18 is made of lead-tin solder instead of indium, and an example wherein the first solder layer 14 is made of lead-tin solder instead of gold-tin solder.

In Japanese Unexamined Patent Application Publication No. H06-350202, a semiconductor light-emitting device having a construction similar to the foregoing laser diode assembly 10 is disclosed.

When the laser diode device is jointed on the submount, or the submount is jointed on the heatsink, even if the same amount of solder is provided every time, a part of excessive solder overflows from the joint face, since surface state of the joint faces of the laser diode device, the submount, or the heatsink is subtly changed.

As shown in FIG. 8, the overflowing solder is swollen in the shape of a bulb, and remains at edges of the joint area, particularly at edges of the laser diode device. This phenomenon that solder is swollen in the shape of a bulb is significant particularly when flux is not used.

The solder residue may become an obstacle in subsequent mounting of the laser diode assembly, or have an adverse effect on laser characteristics. In particular, if the bulb-shaped solder residue is formed on the emitting end face side of the laser diode device when the laser diode device is jointed on the submount or the heatsink, it is not preferable for the laser characteristics.

SUMMARY OF THE INVENTION

In view of the foregoing, it is an object of the invention to provide a laser diode assembly which can, in assembly, inhibit solder overflow from a solder joint face, and prevent the overflowing solder from forming bulb-shaped solder residue on a laser diode device, a submount, or a heatsink.

The inventors have noted the following in the process of the research to solve the problems. That is, the submount and the heatsink to mount the laser diode device are greatly premised on that their joint areas have high flatness in order to attain good mounting. However, when solid solder is temporarily fixed before the laser diode device is mounted on the submount or the heatsink, excessive fine flatness of the joint area works adversely. That is, contact becomes hard, peeling is caused, air enters, leading to joint failure.

Meanwhile, lowering flatness of the submount or the heatsink has an unfavorable effect on mounting precision itself.

Therefore, in order to attain good joint, the inventor has devised providing grooves, which maintain flatness of the joint area of the submount or the heatsink in the perfect state as long as possible, and which makes excessive solder flow around the joint area in order to process the excessive solder. The inventor has confirmed the validity thereof through experiments, and realized the following inventions (first to tenth inventions).

Specifically, the first invention is a laser diode assembly comprising: a laser diode device; a submount jointed on a substrate side of the laser diode device with a first solder layer in between; and a heatsink jointed on a rear face side of the submount with a second solder layer in between, wherein the submount has a groove (hereinafter referred to submount groove) at least at a part of a periphery of a joint area along border of the joint area jointed with the laser diode device.

In this laser diode assembly, when solder joint between the laser diode device and the submount is performed, excessive solder flows into the submount groove. That is, the submount groove functions as a solder pool for the excessive solder, and further works to drain the excessive solder outside. Therefore, bulb-shaped excessive solder never remains around the joint area between the laser diode device and the submount.

It is not indispensable to provide the submount groove at a whole length of the periphery of the joint area. When the submount groove is provided only at a part of the periphery, the foregoing effect can be obtained on some level.

Further, in this laser diode assembly, the heatsink can have a groove (hereinafter referred to as heatsink groove) around its joint area along border of a joint area jointed with the submount.

Therefore, when solder joint between the submount and the heatsink is performed, excessive solder flows into the heatsink groove. That is, the heatsink groove functions as a solder pool for the excessive solder, and further works to drain the excessive solder outside. Consequently, bulb-shaped excessive solder never remains also around the joint area between the submount and the heatsink.

Next, the second invention is a laser diode assembly comprising: a laser diode device; and a heatsink jointed on a substrate side of the laser diode device with a solder layer in between, wherein the heatsink has a groove (hereinafter referred to as second heatsink groove) at least at a part of a periphery of a joint area along border of the joint area jointed with the laser diode device.

In this laser diode assembly, the laser diode device is directly jointed to the heatsink. When solder joint between this laser diode device and the heatsink is performed, excessive solder flows into the second heatsink groove as in the foregoing. Therefore, bulb-shaped excessive solder never remains around the joint area between the laser diode device and the heatsink.

It is not indispensable to provide the second heatsink groove at a whole length of the periphery of the joint area. When the second heatsink groove is provided only at a part of the periphery of the joint area, effect of the invention can be obtained on some level.

In the first and the second inventions, it is preferable that the submount groove or the heatsink groove is formed along border of the joint area on a rear end face side opposite of an emitting end face of the laser diode device, and border of the joint area on both side wall sides of the laser diode device.

It is not preferable that excessive solder flows onto the emitting end face side of the laser diode device. Therefore, it is preferable not to provide the submount groove and the heatsink groove on the emitting end face side.

In the first invention, it is more preferable that several thin grooves whose width is smaller and depth is shallower than that of the submount groove are formed on the joint area of the submount so that the thin grooves are spaced from each other and at least one ends of the thin grooves contact with the submount groove.

Similarly, in the second invention, several heatsink thin grooves whose width is smaller and depth is shallower than that of the second heatsink groove are formed on the joint area of the heatsink so that the heatsink thin grooves are spaced from each other and at least one ends of the heatsink thin grooves contact with the second heatsink groove.

In the first invention, in order to improve joint characteristics between the submount and the heatsink, it is possible to provide thin grooves having a construction similar to that of the submount thin grooves in the joint area of the heatsink.

By providing the submount thin grooves and the heatsink thin grooves, when jointing the laser diode device, it becomes possible to further facilitate excessive solder flowing from the joint area, and improve contact characteristics between the laser diode device and the submount.

Further, when solid solder is used, the thin grooves in the joint area facilitate contact temporally fixing of solder. Therefore, remaining air between solder and the submount or the heatsink, which causes joint failure such as floatage never arises.

Arrangement of the submount thin grooves or the heatsink thin grooves is not limited. However, it is preferable that the thin grooves are provided so that the thin grooves extend in the direction diagonally to the submount groove or the second heatsink groove, or extend in the direction parallel to border of the joint area on the rear end face side of the laser diode device. Flowing of excessive solder onto the emitting end face side of the laser diode device thereby can be inhibited.

It is more preferable that outlets on the emitting end face side of the laser diode device of the submount groove, the heatsink groove, the second heatsink groove, and the thin grooves are closed. Therefore, flowing of excessive solder onto the emitting end face side of the laser diode device can be inhibited.

Further, in the first invention, an extension groove of the submount groove can extend to ends of the submount. In the second invention, an extension groove of the second heatsink groove can extend to ends of the heatsink. Therefore, excessive solder pooled in the submount groove or the second heatsink groove can easily flow outside through the extension groove.

A depth and a width of the submount groove, the heatsink groove, the second heatsink groove, and the extension groove are in the range from 1 µm to 1 mm. When the size is less than 1 µm, it is difficult to drain excessive solder. On the contrary, if the size is over 1 mm, effect is not improved, and strength of the submount and the heatsink may be lowered.

When the submount thin grooves or the heatsink thin grooves are too large, solder may flow too much, or heat release effect of the submount or the heatsink may be lowered. Meanwhile, when the thin grooves are too small, providing the thin grooves becomes ineffective. Considering the foregoing, a depth and a width of the submount thin groove and the heatsink thin groove are approximately from 1 µm to several hundred µm. A distance between respective submount thin grooves or the respective heatsink thin grooves is approximately from 1 µm to 1-2 mm. It is not preferable that the distance between the respective submount thin grooves or the respective heatsink thin grooves is less than 1 µm, since irregularity in the joint area is too fine and a surface of the joint area becomes a state similar to surface roughness. Meanwhile, since an area of the joint area is not so large, providing the submount thin grooves and the heatsink thin grooves becomes ineffective when the distance thereof is equal to or more than 2 mm.

It is not indispensable that the submount groove or the heatsink groove is provided at border of the joint area. A groove crossing the joint area can provide effect of the invention.

That is, still other laser diode assembly of the invention (hereinafter referred to as the third invention) is a laser diode assembly comprising: a laser diode device; a submount jointed on a substrate side of the laser diode device with a first solder layer in between; and a heatsink jointed on a rear face side of the submount with a second solder layer in between, wherein the submount has a groove (hereinafter referred to as submount transverse groove) which crosses a joint area jointed with the laser diode device, and reaches edges of the submount.

Number of the submount transverse groove can be one or plural. Further, it is not necessary that several submount transverse grooves are parallel to each other. It is preferable that the submount transverse groove crosses the joint area of the submount so that the submount transverse groove crosses any of border on the side wall sides and border on the rear end face side of the laser diode device in the joint area of the submount, and does not cross border on the emitting end face side, to prevent solder from flowing onto the emitting end face side of the laser diode device. Further, it is more preferable that the submount transverse groove crosses approximately the center of the joint area of the submount in the direction parallel to the emitting end face of the laser diode device.

Further, still other laser diode assembly of the invention (hereinafter referred to as the fourth invention) is a laser diode assembly comprising: a laser diode device; and a heatsink jointed on a substrate side of the laser diode device with a solder layer in between, wherein the heatsink has a groove (hereinafter referred to as heatsink transverse groove) which crosses a joint area jointed with the laser diode device, and reaches edges of the heatsink.

Number of the heatsink transverse groove can be one or plural. Further, it is not necessary that several heatsink transverse grooves are parallel to each other. It is preferable that the heatsink transverse groove crosses the joint area of the heatsink so that the heatsink transverse groove crosses any of border on the side wall sides and border on the rear end face side of the laser diode device in the joint area of the heatsink, and does not cross border on the emitting end face side, to prevent solder from flowing onto the emitting end face side of the laser diode device. Further, it is more preferable that the heatsink transverse groove crosses approximately the center of the joint area of the heatsink in the direction parallel to the emitting end face of the laser diode device.

In the third and the fourth inventions, by providing the submount transverse groove and the heatsink transverse groove, when solder joint between the laser diode device and the submount is performed, or solder joint between the laser diode device and the heatsink is performed, excessive solder flows into the submount transverse groove and the heatsink transverse groove, the submount transverse groove and the heatsink transverse groove function as a solder pool for the excessive solder, and the excessive solder is drained outside. Therefore, bulb-shaped excessive solder never remains around the joint area between the laser diode device and the submount, or the joint area between the laser diode device and the heatsink.

Respective sizes of the submount transverse groove and the heatsink transverse groove can be the same as of the submount groove and the second heatsink groove.

In the first invention, the submount groove is provided, and the submount thin grooves are further provided. In the second invention, the second heatsink groove is provided, and the heatsink thin grooves are further provided. However, when grooves corresponding to the submount thin grooves or the heatsink thin grooves are provided on the joint area of the submount or the heatsink without the submount groove or the second heatsink groove, effect of the invention can be also obtained.

That is, still other laser diode assembly of the invention (hereinafter referred to as the fifth invention) is a laser diode assembly comprising: a laser diode device; a submount jointed on a substrate side of the laser diode device with a first solder layer in between; and a heatsink jointed on a rear face side of the submount with a second solder layer in between, wherein the submount has several thin grooves in a joint area jointed with the laser diode device.

Further, still other laser diode assembly of the invention (hereinafter referred to as the sixth invention) is a laser diode assembly comprising: a laser diode device; and a heatsink jointed on a substrate side of the laser diode device with a solder layer in between, wherein the heatsink has several thin grooves in a joint area jointed with the laser diode device.

In the fifth and the sixth inventions, respective sizes of the grooves provided in the joint area of the submount and the joint area of the heatsink can be the same as of the submount thin grooves and the heatsink thin grooves. Arrangement of the grooves is flexible. For example, the grooves can be several thin grooves parallel to each other, or thin grooves in the shape of lattice.

In the first to the sixth inventions, the laser diode device can be a laser diode device in the shape of a chip, in the shape of a laser bar, or in the shape of a two dimensional array. Further, solder types are not limited. Solder can be solid type or cream type. Further, materials for the submount and the heatsink are not limited.

In the process of further researching the method of manufacturing the laser diode assembly, the following was confirmed by experiments.

First, as shown in FIG. 13, in a laser diode assembly mounting a laser diode device whose heat release value during operation is large, when a submount groove or a heatsink groove is provided along border of a joint area of a submount or border of a joint area of a heatsink, due to an air layer pooling in the submount groove or the heatsink groove, heat conductivity from the laser diode device to the submount and heat conductivity from the submount to the heatsink become lowered, and heat release characteristics of the heat release value generated in the laser diode device may be lowered in some cases.

Therefore, in such a laser diode assembly mounting the laser diode device whose heat release value is large, in order to maintain good heat release characteristics of the laser diode device, it is appropriate not to provide the submount groove or the heatsink groove along the joint area of the submount or the joint area of the heatsink in many cases.

Secondly, fluidity of solder melt in a submount transverse groove or a heatsink transverse groove whose groove diameter is small depends on capillary phenomenon.

Thirdly, even when a submount transverse groove or a heatsink transverse groove crosses a submount face or a heatsink face on the emitting end face side of the laser diode device at a obtuse crossing angle of, for example, 45° or less, the crossing angle is smaller than in the case that the transverse groove crosses perpendicular to the submount face or the heatsink face. Therefore, it was found that in this case, excessive solder does not flow onto the submount face or the heatsink face on the emitting end face side of the laser diode device.

Fourthly, in the third and the fourth inventions, the submount transverse groove or the heatsink transverse groove extends from edge to edge of the submount or the heatsink. However, as long as the submount transverse groove or the heatsink transverse groove has a groove capacity capable of housing excessive solder, it is not necessary that the submount transverse groove or the heatsink transverse groove extends from edge to edge of the submount or the heatsink.

Therefore, based on the foregoing knowledge, a laser diode assembly according to the invention (hereinafter referred to as the seventh invention) is a laser diode assembly comprising: a laser diode device; a submount jointed on a substrate side of the laser diode device with a first solder layer in between; and a heatsink jointed on a rear face side of the submount with a second solder layer in between, wherein the submount has a groove (hereinafter referred to as submount transverse groove) which extends in a joint area jointed with the laser diode device without crossing a submount face on the emitting end face side of the laser diode device, or a groove (hereinafter referred to as submount cross groove) which crosses the submount face on the emitting end face side of the laser diode device at a crossing angle of 45° or less, and extends in the joint area of the submount.

The seventh invention is a laser diode assembly wherein the laser diode device is jointed to the heatsink with the submount in between. By providing the submount transverse groove, when solder joint between the laser diode device and the submount is performed, excessive solder melt flows into the submount transverse groove, and flows in the submount transverse groove due to capillary phenomenon of the submount transverse groove, the submount transverse groove functions as a solder pool for the excessive solder melt, and the excessive solder melt is drained outside.

Therefore, bulb-shaped excessive solder never remains around the joint area between the laser diode device and the submount.

Number of the submount transverse groove and the submount cross groove is not limited, and can be one or plural depending on sizes of the joint area of the laser diode device. Further, it is not necessary that the submount transverse groove and the submount cross groove extend from one submount face to the other submount face. As long as the submount transverse groove and the submount cross groove function as a solder pool for excessive solder melt, their both ends can be closed.

It is preferable to provide submount branch grooves whose one ends contact with the submount transverse groove, and which extend in the direction crossing the submount transverse grove.

Excessive solder melt which is pooled in the submount transverse groove or the submount cross groove thereby can be drained into the submount branch grooves, pooled in the submount branch grooves due to capillary phenomenon, or drained out outside.

Unless excessive solder melt overflows onto the submount surface since the submount branch grooves are short, it is not indispensable that the submount branch grooves extend to the submount face opposite of the emitting end face side of the laser diode device.

In the seventh invention, as the submount, the heatsink can comprises a groove (hereinafter referred to as heatsink transverse groove) which extends in a joint area jointed of the heatsink on which the submount is jointed without crossing a heatsink face on the emitting end face side of the laser diode device, or a groove (hereinafter referred to as heatsink cross groove) which crosses the heatsink face on the emitting end face side of the laser diode device at a crossing angle of 45° or less, and extends in the joint area of the heatsink.

Further, it is possible to provide heatsink branch grooves whose one ends contact with the heatsink transverse groove, and which extend in the direction crossing the heatsink transverse grove.

In the foregoing construction of the seventh invention, by providing the heatsink transverse groove or the heatsink cross groove, when solder joint between the submount and the heatsink is performed, excessive solder melt is drained into the heatsink transverse groove, the excessive melt flows in the heatsink transverse groove due to capillary phenomenon of the heatsink transverse groove, the heatsink transverse groove functions as a solder pool for the excessive solder melt, and the excessive solder melt is drained outside. Therefore, bulb-shaped excessive solder never remains around the joint area between the submount and the heatsink.

Number of the heatsink transverse groove and the heatsink cross groove is not limited, and can be one or plural depending on sizes of the joint area of the heatsink. Further, it is not necessary that the heatsink transverse groove and the heatsink cross groove extend from one heatsink face to the other heatsink face. As long as the heatsink transverse groove and the heatsink cross groove function as a solder pool for excessive solder melt, their both ends can be closed.

A groove diameter of the submount transverse groove, the submount cross groove, the submount branch groove, the heatsink transverse groove, the heatsink cross groove, and the heatsink branch groove is preferably a groove diameter with which capillary phenomenon of solder melt which joints the laser diode device or the submount is generated. In this specification, the capillary phenomenon of solder melt means that fluidity of solder melt is improved by the submount transverse groove and the like with a small groove diameter.

When a groove diameter is larger than the groove diameter with which the capillary phenomenon of solder melt is generated, a drawback of lowered heat release characteristics becomes more significant than an advantage of drainage of excessive solder melt. Meanwhile, when a groove diameter is too small, fluid resistance of solder melt inside the groove with a small groove diameter becomes larger than improvement of fluidity of solder melt due to the capillary phenomenon, so that fluidity of solder melt is lowered, and occlusion may be caused. Generally, the groove size is from 1 μm to 1 mm, or from several dozen μm to 300 μm.

A laser diode assembly according to the invention (hereinafter referred to as the eighth invention) is a laser diode assembly comprising: a laser diode device; and a heatsink jointed on a substrate side of the laser diode device with a solder layer in between, wherein the heatsink has a groove (hereinafter referred to as heatsink transverse groove) which extends in a joint area jointed with the laser diode device without crossing a heatsink face on the emitting and face side of the laser diode device, or a groove (hereinafter referred to as heatsink cross groove) which crosses the heatsink face on the emitting end face side of the laser diode device at a crossing angle of 45° or less, and extends in the joint area of the heatsink.

In the eighth invention, the laser diode device is directly jointed to the heatsink. By providing the heatsink transverse groove or the heatsink cross groove, when solder joint between the laser diode device and the heatsink is performed, it is possible that excessive solder melt is drained into the heatsink transverse groove, the excessive solder melt flows in the heatsink transverse groove due to capillary phenomenon of the heatsink transverse groove, the heatsink transverse groove functions as a solder pool for the excessive solder melt, and the excessive solder melt is drained outside.

Therefore, bulb-shaped excessive solder never remains around the joint area between the laser diode device and the heatsink.

Number of the heatsink transverse groove and the heatsink cross groove is not limited, and can be one or plural depending on sizes of the joint area of the laser diode device. Further, it is not necessary that the heatsink transverse groove and the heatsink cross groove extend from one heatsink face to the other heatsink face. As long as the heatsink transverse groove and the heatsink cross groove can function as a solder pool for excessive solder melt, their both ends can be closed.

Further, in the eighth invention, it is preferable to provide heatsink branch grooves whose one ends contact with the heatsink transverse groove and which extend in the direction crossing the heatsink transverse groove.

Similarly to of the seventh invention, each groove diameter of the heatsink transverse groove, the heatsink cross groove, and the heatsink branch groove is about a size with which capillary phenomenon of solder melt is generated.

A method of manufacturing a laser diode assembly according to the invention (hereinafter referred to as the ninth invention) is a method of manufacturing a laser diode assembly having a structure in which a laser diode device is jointed to a heatsink with a submount in between, when the laser diode device is jointed to the submount, comprising the steps of: forwarding the submount holding the laser diode device on a joint area of the submount into a reflow oven, and melting solder on the joint area of the submount; and draining excessive solder out of the melted solder between the submount and the laser diode device due to capillary phenomenon generated in a groove crossing the joint area of the submount, and pooling the excessive solder in the groove.

In the ninth invention, excessive solder out of the melted solder flows between the submount and the laser diode device due to capillary phenomenon generated in the groove crossing the joint area of the submount, and is pooled in the groove. Therefore, when solder joint between the laser diode device and the submount is performed, bulb-shaped excessive solder never remains around the joint area between the laser diode device and the submount.

Further, when the submount is jointed to the heatsink, the ninth invention comprises the steps of: forwarding the heatsink holding the submount on a joint area of the heatsink into a reflow oven, and melting solder on the joint area of the heatsink; and draining excessive solder out of the melted solder between the heatsink and the submount due to capillary phenomenon generated in a groove crossing the joint area of the heatsink, and pooling the excessive solder in the groove.

In the foregoing construction, excessive solder out of the melted solder flows between the submount and the heatsink due to capillary phenomenon generated in the groove crossing the joint area of the heatsink, and is pooled in the groove. Therefore, when solder joint between the submount and the heatsink is performed, bulb-shaped excessive solder never remains around the joint area between the submount and the heatsink.

Other method of manufacturing a laser diode assembly according to the invention (hereinafter referred to as the tenth invention) is a method of manufacturing a laser diode assembly having a structure in which a laser diode device is jointed to a heatsink, when the laser diode device is jointed to the heatsink, comprising the steps of: forwarding the heatsink holding the laser diode device on a joint area of the heatsink into a reflow oven, and melting solder on the joint area of the heatsink; and draining excessive solder out of the melted solder between the heatsink and the laser diode device due to capillary phenomenon generated in a groove crossing the joint area of the heatsink, and pooling the excessive solder in the groove.

In the tenth invention, excessive solder out of the melted solder flows between the heatsink and the laser diode device due to capillary phenomenon generated in the groove crossing the joint area of the heatsink, and is pooled in the groove. Therefore, when solder joint between the laser diode device and the heatsink is performed, bulb-shaped excessive solder never remains around the joint area between the laser diode device and the heatsink.

DETAILED DESCRIPTION OF THE PRESENTLY PREFERRED EMBODIMENTS

Figure 7:
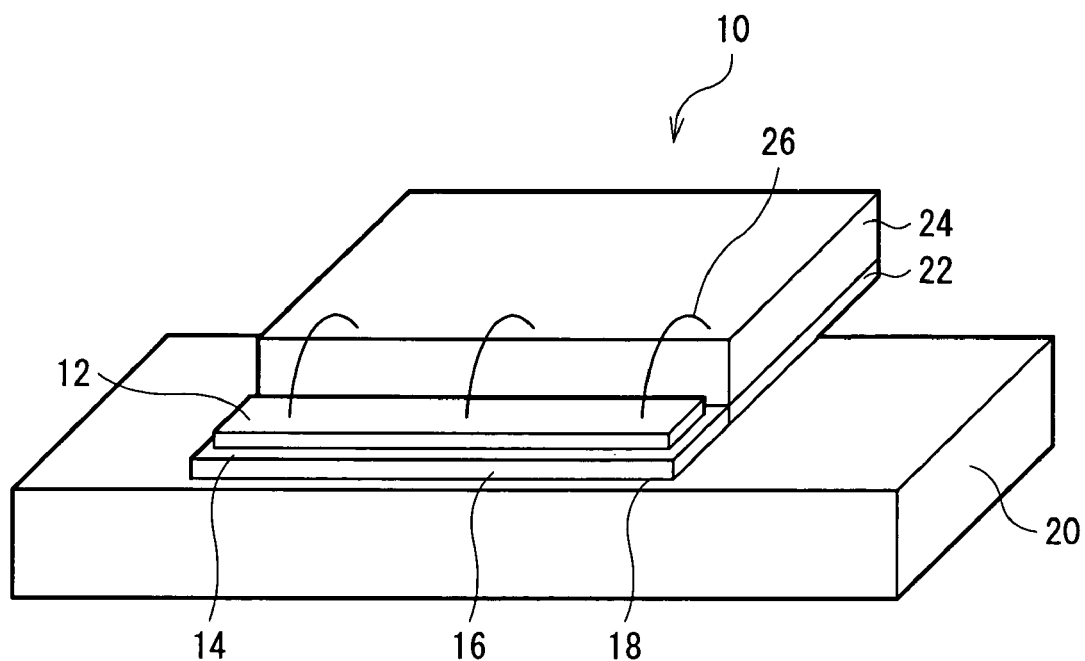
FIG. 7 is an oblique perspective figure showing a construction of a conventional laser diode assembly.
Figure 8:
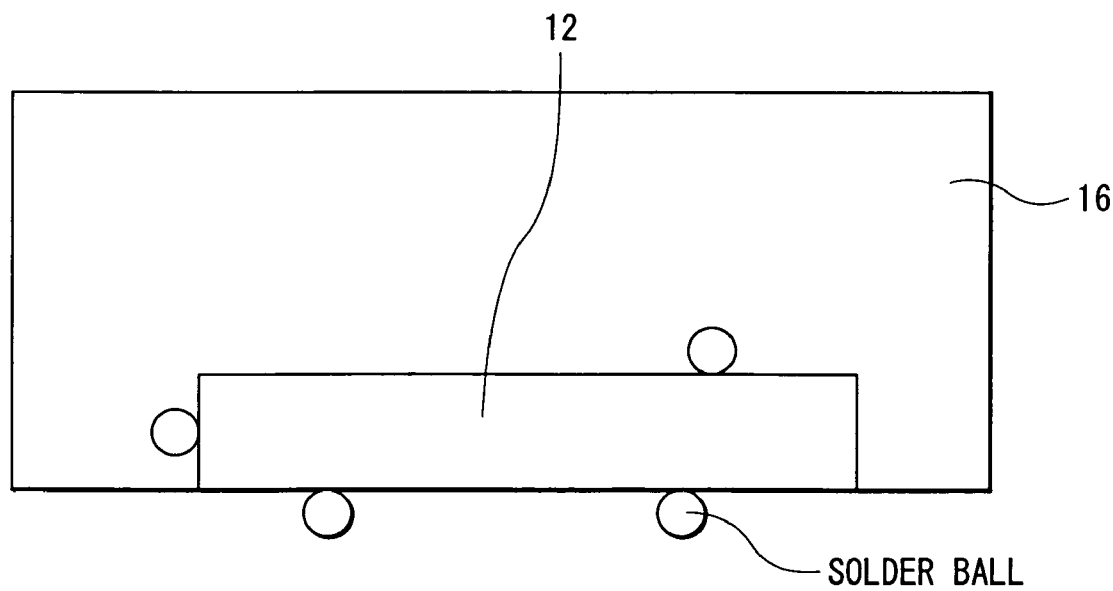
FIG. 8 is a plane view of a submount to explain problems of the conventional laser diode assembly.

Concrete and detailed descriptions will be hereinafter given of embodiments of the invention with reference to the attached drawings. In the following embodiments and modifications, the same components as in a conventional construction (FIG. 7) will be described with the same symbols as in the conventional construction.

First Embodiment

Figure 1:
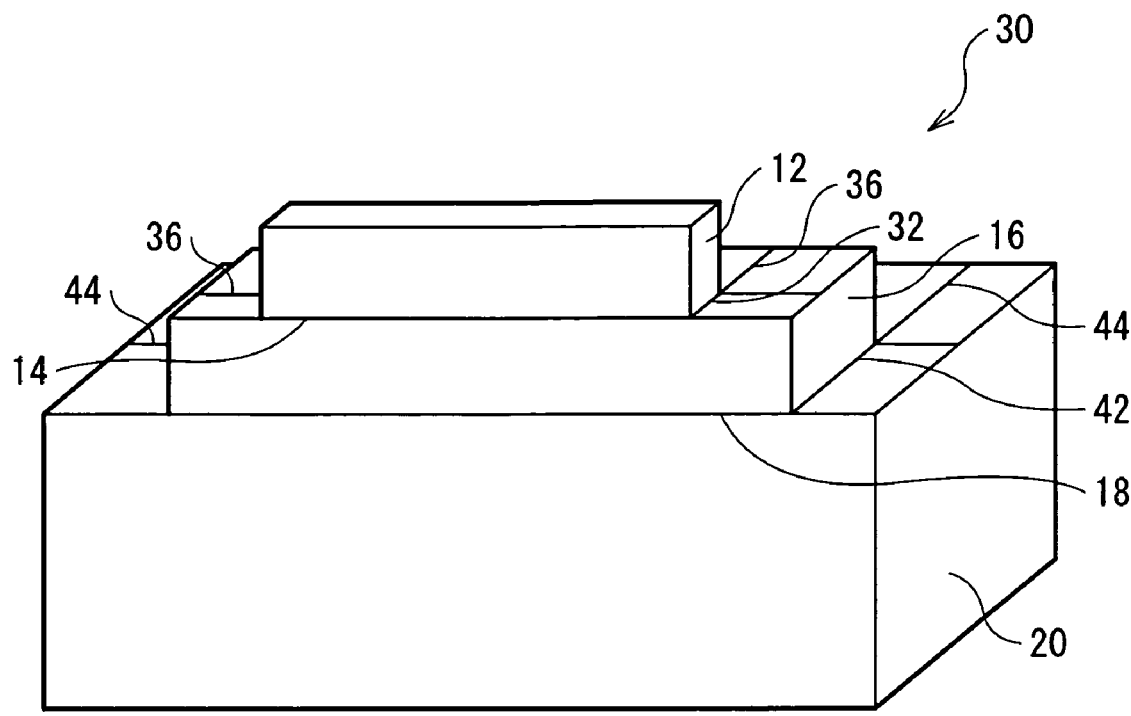
FIG. 1 is an oblique perspective figure showing a construction of a substantial part of a laser diode assembly according to a first embodiment of the invention.
Figure 2:
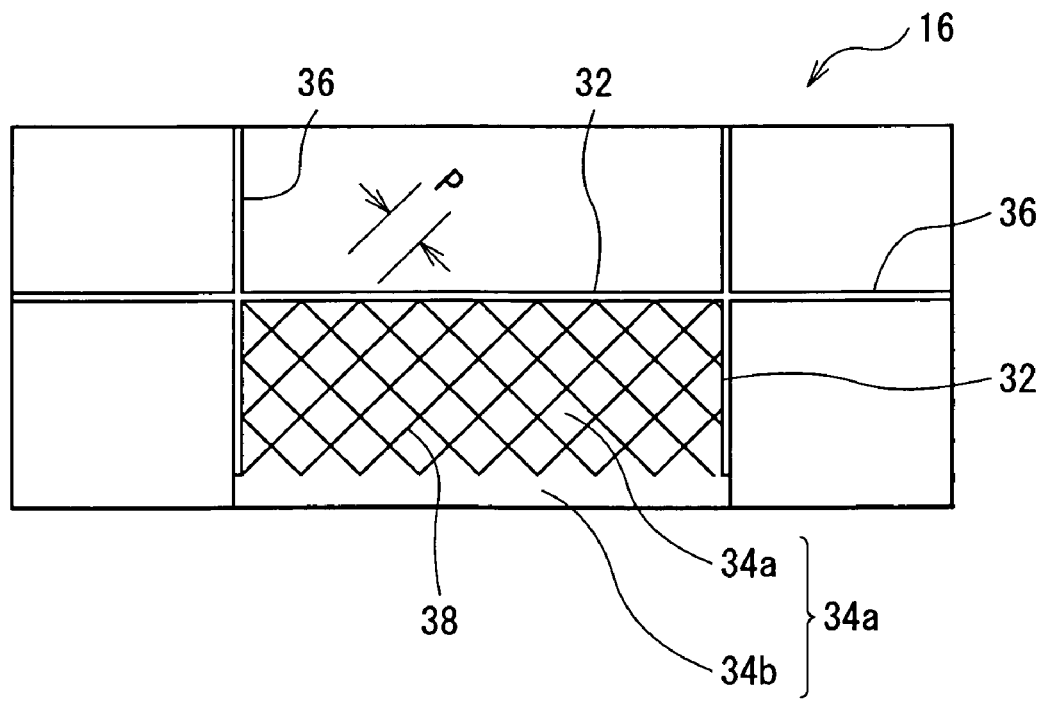
FIG. 2 is a plane view showing a construction of submount grooves.
Figure 3:
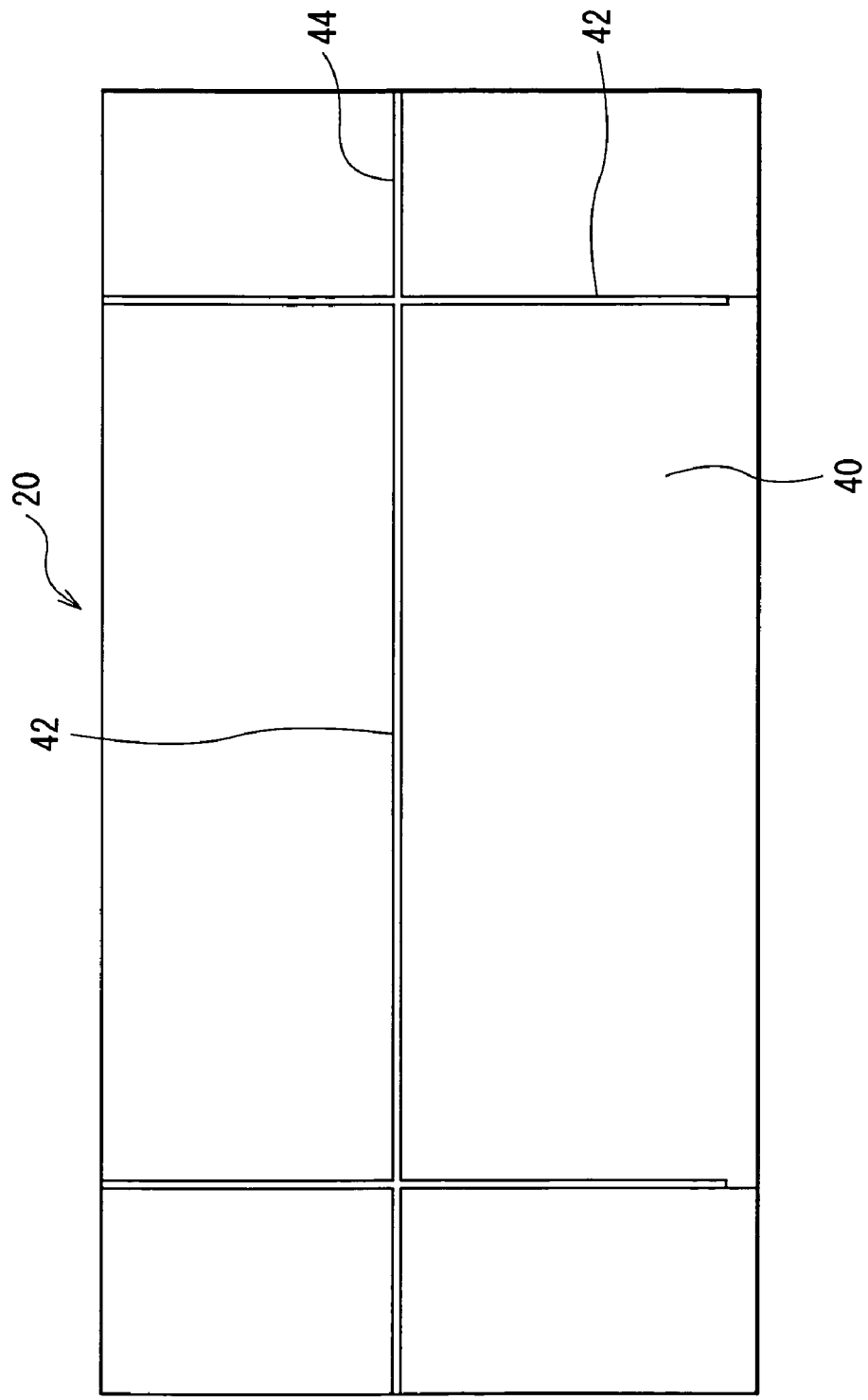
FIG. 3 is a plane view showing a construction of heatsink grooves.

This embodiment is an example of a laser diode assembly according to a first invention. FIG. 1 shows a construction of a substantial part of the laser diode assembly, FIG. 2 shows a construction of grooves of a submount, and FIG. 3 shows a construction of grooves of a heatsink, respectively.

As shown in FIG. 1, a laser diode assembly 30 of this embodiment comprises a laser diode device 12, a submount 16 jointed to a substrate side of the laser diode device 12 with a first solder layer 14 in between, and a heatsink 20 jointed to a rear face side of the submount 16 with a second solder layer 18 in between as a substantial part similar to a conventional laser assembly 10.

In the laser diode assembly 30, the submount 16 comprises a groove 32 (hereinafter referred to as submount groove) and an extension groove 36. The submount groove 32 is formed around a joint area 34 along border of the joint area 34 jointed with the laser diode device 12. The extension groove 36 is a groove extended from the submount groove 32 to edges of the submount 16.

The submount groove 32 is formed around the joint area 34 along border of the joint area 34 of the submount 16, which is on both side wall sides and a rear end face side opposite of an emitting end face of the laser diode device 12.

Further, in the submount 16, many thin grooves 38 (hereinafter referred to as submount thin grooves), whose groove width is smaller and whose groove depth is shallower than of the submount groove 32 are formed so that the submount thin grooves 38 are spaced from each other and at least one ends of the submount thin grooves 38 contact with the submount groove 32. The submount thin grooves 38 are formed on the joint area 34 of the submount 16 in the shape of lattice and in the direction diagonally to the submount groove 32.

In this embodiment, the submount groove 32 and the submount thin grooves 38 are not provided on the emitting end face side of the laser diode device 12. That is, the submount groove 32 and the submount thin grooves 38 are closed on the emitting end face side of the laser diode device 12. The joint area 34 is composed of a joint area 34a wherein the submount thin grooves 38 are arranged and a joint area 34b which is on the continuous same plane as areas other than the joint area 34, wherein the submount thin grooves 38 are not arranged.

As shown in FIGS. 1 and 3, the heatsink 20 also comprises a groove 42 (hereinafter referred to as heatsink groove) formed around a joint area 40 along border of the joint area 40 of the heatsink 20 wherein the submount 16 and the heatsink 20 are jointed and an extension groove 44 extended from the heatsink groove 42 to edges of the heatsink 20.

The heatsink groove 42 is formed around the joint area 40 along border of the joint area 40 of the heatsink 20, which is on the both side wall sides and the rear end face side opposite of the emitting end face of the laser diode device 12.

Though not shown, it is possible to provide thin grooves similar to the submount thin grooves 38 in the joint area 40 of the heatsink 20.

A depth and a width of the submount groove 32, the heatsink groove 42, and the extension grooves 36 and 44 are, for example, from 1 μm to 1 mm.

Meanwhile, a depth and a width of the submount thin groove 38 is approximately from 1 μm to several hundred μm. When the depth and the width of the submount thin groove 38 are too large, solder might excessively flow, or heat release effect of the submount 16 might be lowered. On the contrary, when the depth and the width of the submount thin groove 38 are too small, providing the thin grooves becomes ineffective. A distance P between the respective submount thin grooves 38 is approximately from 1 μm to 1-2 mm. It is not preferable that the distance P between the submount thin grooves 38 is less than 1 μm, since irregularity is too fine and a surface of the joint area 34 becomes a state similar to surface roughness. Further, since an area of the joint area 34 is not so large, providing the submount thin grooves 38 becomes ineffective when the distance P is 2 mm or more.

In this embodiment, regarding the submount 16, when solder joint between the laser diode device 12 and the submount 16 is performed, excessive solder flows into the submount groove 32 through the submount thin grooves 38, the submount groove 32 functions as a solder pool for the excessive solder, and the excessive solder is drained outside through the extension groove 36. Therefore, when the laser diode device 12 and the submount 16 are jointed, bulb-shaped excessive solder never remains around the joint area 34 of the submount 16.

When a joint area of the laser diode device 12, that is, the joint area 34 of the submount 16 is small, it is possible to provide only the submount groove 32. It is not indispensable to provide the submount thin grooves 38.

Further, in this embodiment, the submount groove 32 and the submount thin grooves 38 are not provided on the emitting end face side of the laser diode device 12. Therefore, excessive solder never flows onto the emitting end face side of the laser diode device 12.

Furthermore, the heatsink 20 is provided with the heatsink groove 42 and the extension groove 44. Therefore, when solder joint between the submount 16 and the heatsink 20 is performed, excessive solder flows into the heatsink groove 42, the heatsink groove 42 functions as a solder pool for the excessive solder, and the excessive solder is drained outside through the extension groove 44.

Therefore, bulb-shaped excessive solder never remains around the joint area 40 of the heatsink 20.

It is not necessary to provide the submount groove 32 over a whole length of border of the joint area 34 depending on sizes or shapes of the joint area 34 of the submount 16. It is possible to partly provide the submount groove 32, for example, only, at border on the both side wall sides of the laser diode device 12, or only at border on the rear end face side of the laser diode device 12. In such a case, the extension groove 36 contacts with the partly provided submount groove 32.

Modification

Figure 4:
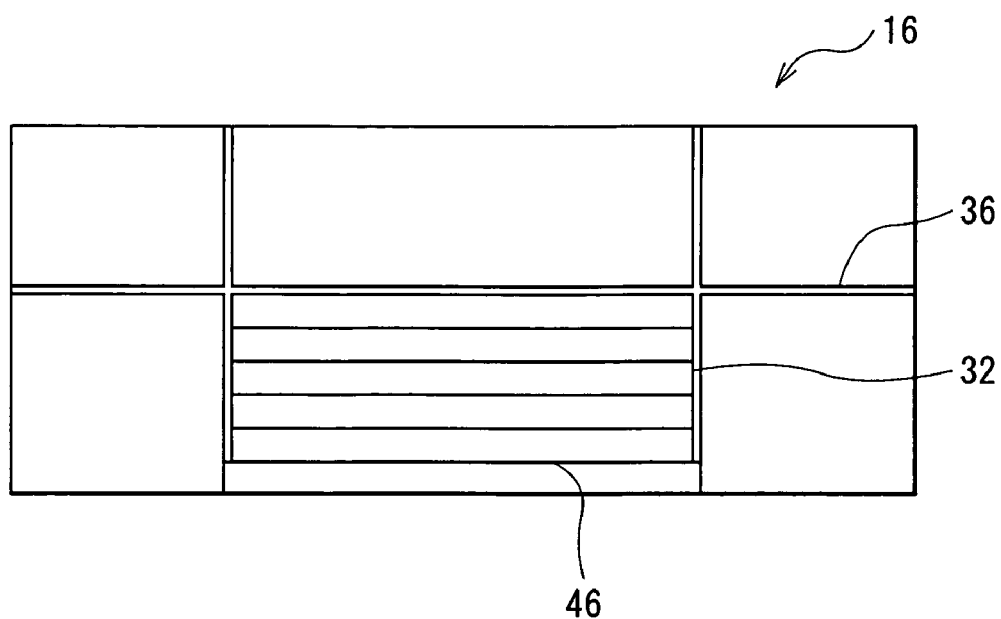
FIG. 4 is a plane view showing a construction of submount grooves of a modification of the first embodiment.

FIG. 4 shows a construction of submount grooves according to a modification of the laser diode assembly of the first embodiment.

In the first embodiment, the submount thin grooves 38 are formed on the joint area 34 of the submount 16 in the shape of lattice and in the direction diagonally to the submount groove 32. In this modification, submount thin grooves 46 are formed on the joint area 34 so that the submount thin grooves 46 are parallel to border of the joint area 34 on the rear end face side of the laser diode device 12.

In this modification, when solder joint between the laser diode device 12 and the submount 16 is performed, effect similar to in the first example can be obtained by providing the submount thin grooves 46.

Further, as other modification, though not shown, thin grooves having a construction similar to of the submount thin grooves can be provided on the joint area 40 of the heatsink 20. It becomes thereby possible that excessive solder further easily flows into the heatsink groove 42 through the thin grooves when solder joint between the submount 16 and the heatsink 20 is performed.

Second Embodiment

Figure 5:
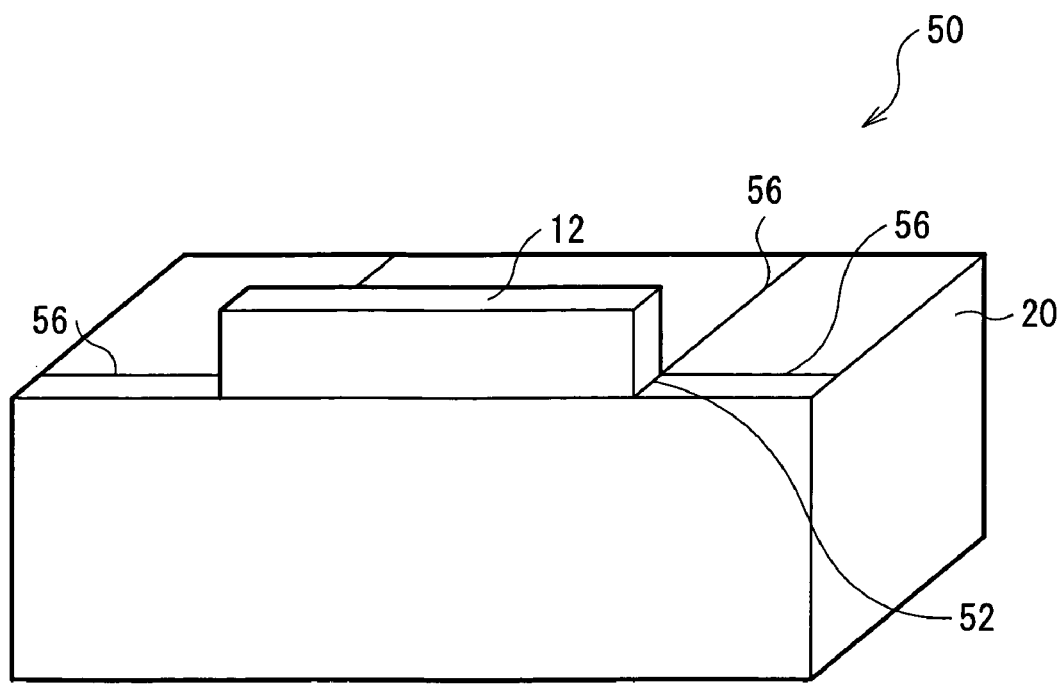
FIG. 5 is an oblique perspective figure showing a construction of a substantial part of a laser diode assembly according to a second embodiment.
Figure 6:
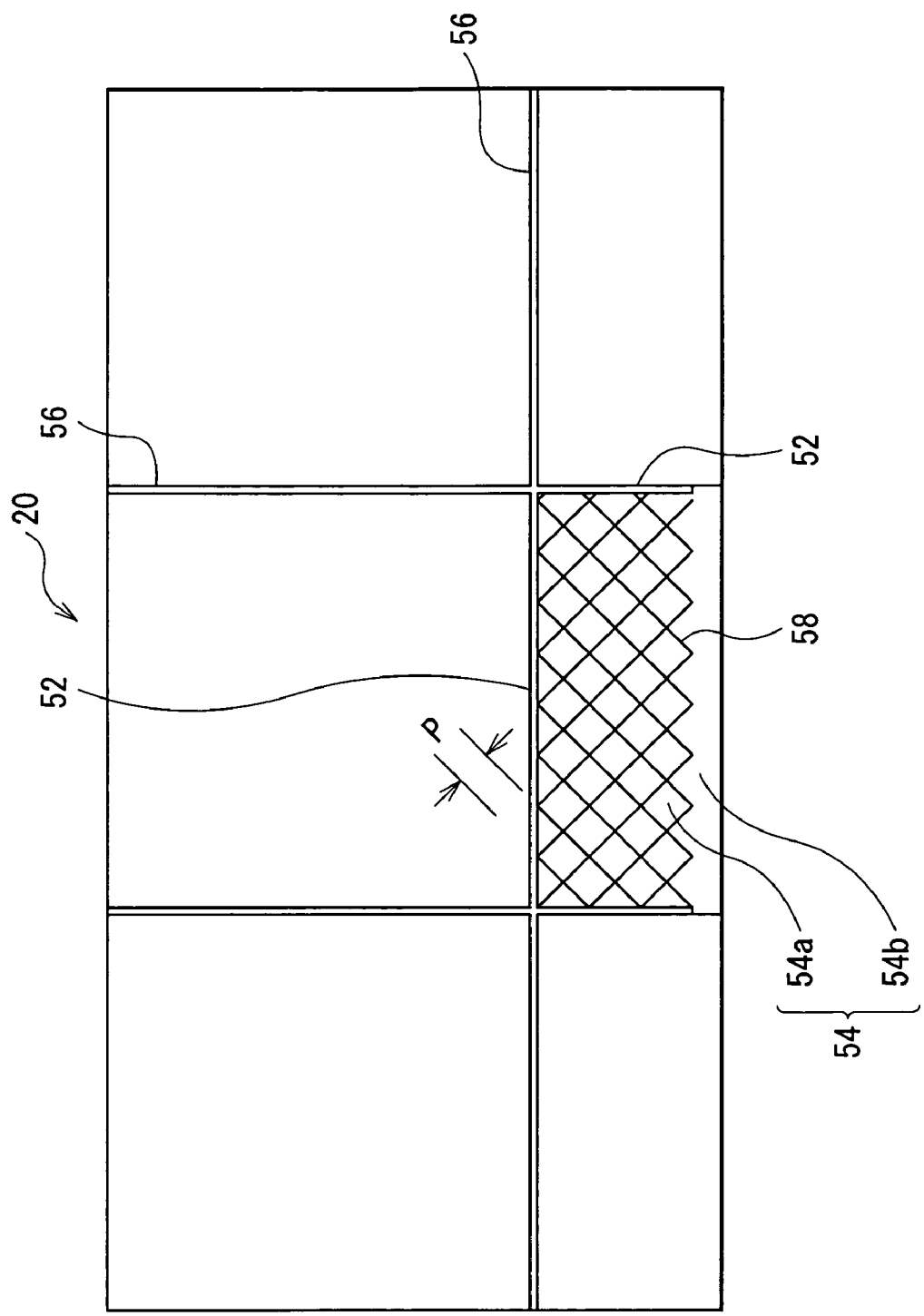
FIG. 6 is a plane view showing a construction of heatsink grooves.

This embodiment relates to a laser diode assembly according to a second invention. FIG. 5 shows a construction of a substantial part of a laser diode assembly 50, and FIG. 6 shows a construction of heatsink grooves, respectively.

The laser diode assembly 50 has the same construction as the conventional laser assembly 10 except that the laser diode device 12 is directly jointed to the heatsink 20 without the foregoing submount 16 in between.

In this embodiment, the heatsink 20 comprises a groove 52 (hereinafter referred to as heatsink groove) and an extension groove 56. The heatsink groove 52 is formed around a joint area 54 along border of the joint area 54 jointed with the laser diode device 12. The extension groove 56 is extended from the heatsink groove 52 to edges of the heatsink 20.

The heatsink groove 52 is formed around the joint area 54 along border of the joint area 54 of the heatsink 20 on the both side wall sides and the rear end face side opposite of the emitting end face of the laser diode device 12.

Further, thin grooves 58 (hereinafter referred to as heatsink thin grooves) whose groove width is smaller and whose groove depth is shallower than of the heatsink groove 52 are formed on the joint area 54 of the heatsink 20 in the shape of lattice and in the direction diagonally to the heatsink groove 52 so that the heatsink thin grooves are spaced from each other and at least one ends of the heatsink thin grooves contact with the heatsink groove 52.

Further, in this embodiment, the heatsink groove 52 and the heatsink thin grooves 58 are not provided on the emitting end face side of the laser diode device 12. That is, the heatsink groove 52 and the heatsink thin grooves 58 are closed on the emitting end face side of the laser diode device 12. The joint area 54 is composed of a joint area 54a wherein the heatsink thin grooves 58 are arranged and a joint area 54b which is on the continuous same plane as areas other than the joint area 54, wherein the heatsink thin grooves 58 are not arranged.

A depth and a width of the heatsink groove 52 and the extension grooves 56 are from 1 μm to 1 mm.

Meanwhile, a depth and a width of the heatsink thin groove 58 is approximately from 1 μm to several hundred μm, considering excessive flow of solder and heat release. A distance P between the respective heatsink thin grooves 58 is approximately from 1 μm to 1-2 mm. It is not preferable that the distance P between the heatsink thin grooves 58 is less than 1 μm, since a surface of the joint area 54 becomes a state similar to surface roughness. Further, since an area of the joint area 54 is not so large, providing the heatsink thin grooves 58 becomes ineffective when the distance P is 2 mm or more.

In this embodiment, when solder joint between the laser diode device 12 and the heatsink 20 is performed, excessive solder flows into the heatsink groove 52 through the heatsink thin grooves 58, the heatsink groove 52 functions as a solder pool for the excessive solder, and the excessive solder is drained outside through the extension groove 56. The extension groove 56 also has a function as a solder pool for the excessive solder.

Therefore, bulb-shaped excessive solder never remains around the joint area 54 of the heatsink 20 when joint between the laser diode device 12 and the heatsink 20 is performed. When the joint area of the laser diode device 12 is small, it is possible to provide only the heatsink groove 52. It is not indispensable to provide the heatsink thin grooves 58.

Further, in this embodiment, the heatsink groove 52 and the heatsink thin grooves 58 are not provided on the emitting end face side of the laser diode device 12. Therefore, excessive solder never flows to the emitting end face side of the laser diode device 12.

It is not necessary to provide the heatsink groove 52 over a whole length of border of the joint area 54 depending on sizes or shapes of the joint area 54 of the heatsink 20. It is possible to partly provide the heatsink groove 52, for example, only at border on the both side wall sides of the laser diode device 12, or only at border on the rear end face side of the laser diode device 12. In such a case, the extension groove 56 contacts with the partly provided heatsink groove 52.

Third Embodiment

Figure 9:
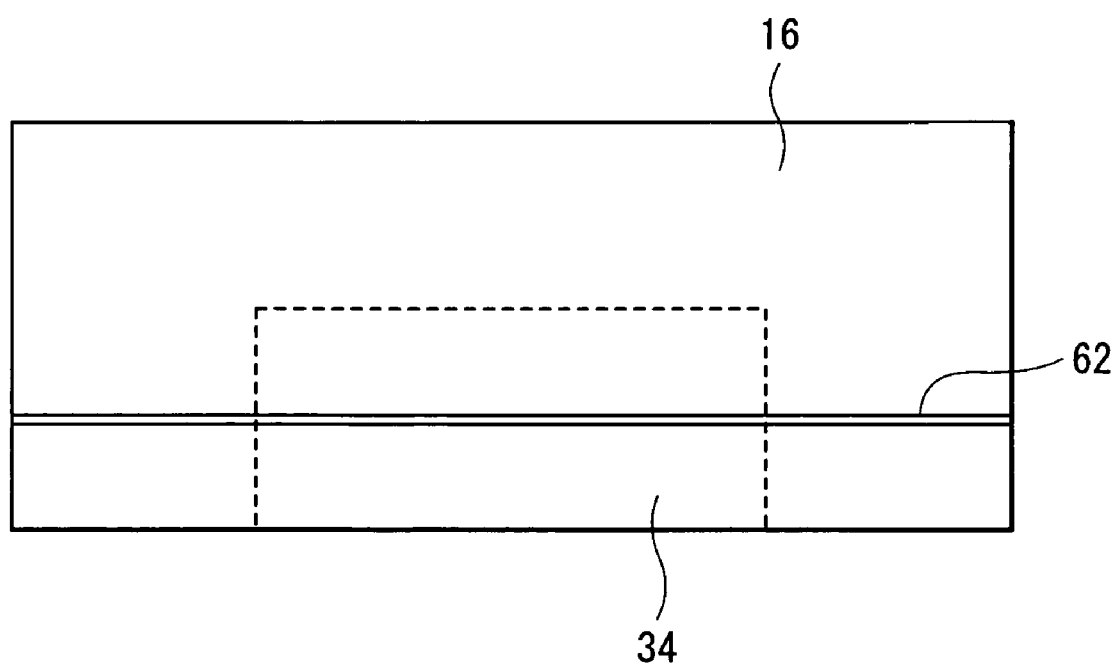
FIG. 9 is a plane view showing a construction of a submount groove of a laser diode assembly according to a third embodiment.

This embodiment relates to a laser diode assembly according to a third invention. FIG. 9 shows a construction of a submount groove thereof.

The laser diode assembly of this embodiment has the same construction as of the laser diode assembly 30 of the first embodiment except that the construction of the submount groove is different.

In this embodiment, the submount 16 comprises one submount transverse groove 62. The submount transverse groove 62 crosses the central part of the joint area 34 jointed with the laser diode device 12 (refer to FIG. 1) in the direction parallel to the emitting end face of the laser diode device 12 to edges of the submount 16.

A size of the submount transverse groove 62 is the same as of the submount groove 32 of the first embodiment. The submount transverse groove 62 can be plural. Further, it is not indispensable that the submount transverse groove 62 crosses the central part of the joint area 34 of the submount 16. The submount transverse groove 62 can cross location of the joint area 34, which is close to the emitting end face.

In this embodiment, when solder joint between the laser diode device 12 and the submount 16 is performed, excessive solder flows into the submount transverse groove 62, the submount transverse groove 62 functions as a solder pool for the excessive solder, and the excessive solder is drained outside.

Therefore, bulb-shaped excessive solder never remains around the joint area 34 of the submount 16 when joint between the laser diode device 12 and the submount 16 is performed.

As in the first embodiment, it is possible to provide the submount thin grooves contacting with the submount transverse groove 62.

Fourth Embodiment

Figure 10:
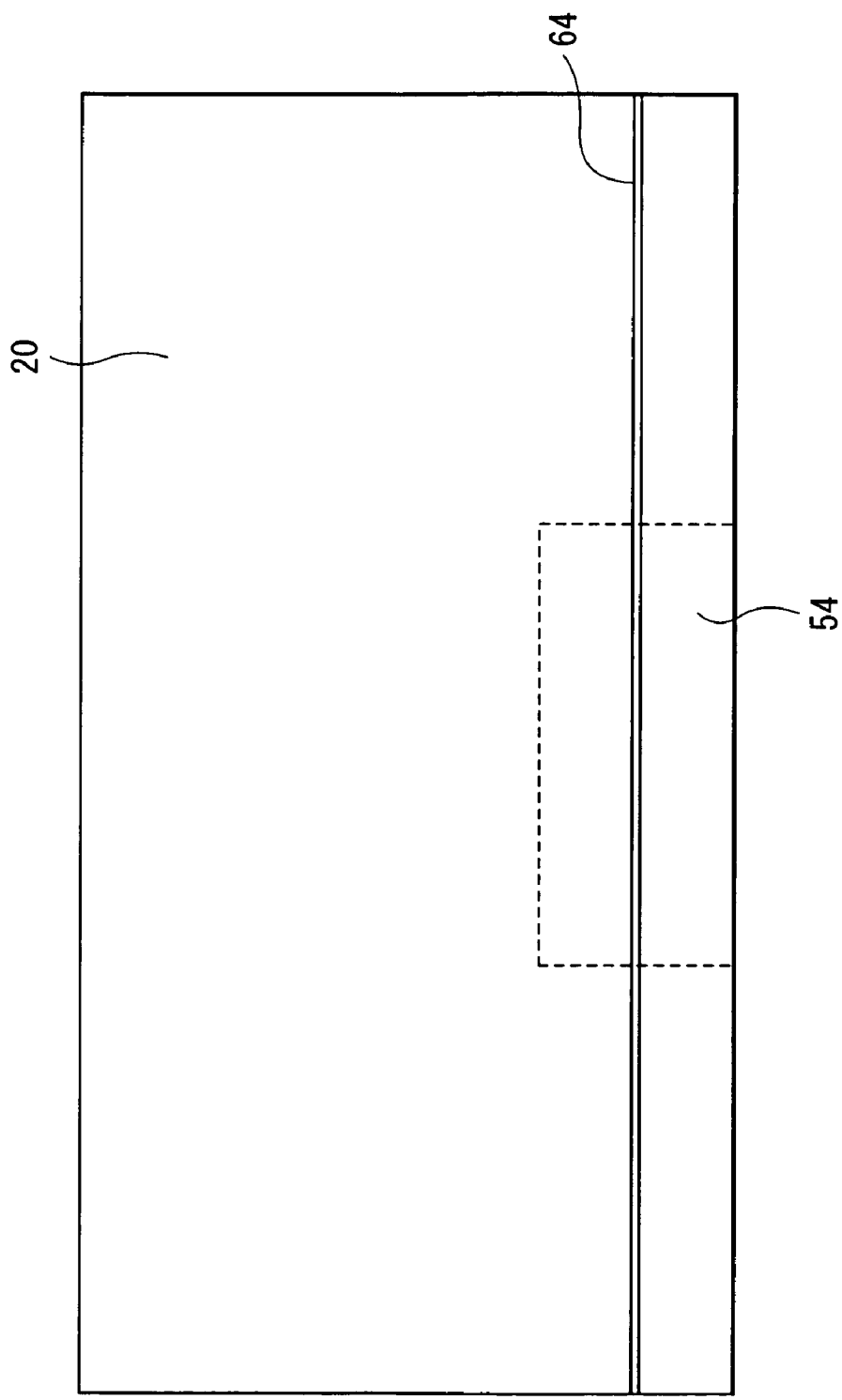
FIG. 10 is a plane view showing a construction of a heatsink groove of a laser diode assembly according to a fourth embodiment.

This embodiment relates to a laser diode assembly according to a fourth invention. FIG. 10 shows a construction of a heatsink groove thereof.

The laser diode assembly of this embodiment is the same as the laser diode assembly 50 of the second embodiment except that the construction of the heatsink groove is different.

In this embodiment, the heatsink 20 comprises a heatsink transverse groove 64. The heatsink transverse groove 64 crosses the central part of the joint area 54 jointed with the laser diode device 12 (refer to FIG. 5) in the direction parallel to the emitting end face of the laser diode device 12 to edges of the heatsink 20.

A size of the heatsink transverse groove 64 is the same as of the second heatsink groove 52 of the third embodiment. The heatsink transverse groove 64 can be plural. Further, it is not indispensable that the heatsink transverse groove 64 crosses the central part of the joint area 54 of the heatsink 20. The heatsink transverse groove 64 can cross location of the joint area 54, which is close to the emitting end face.

In this embodiment, when solder joint between the laser diode device 12 and the heatsink 20 is performed, excessive solder flows into the heatsink transverse groove 64, the heatsink transverse groove 64 functions as a solder pool for the excessive solder, and the excessive solder is drained outside.

Therefore, bulb-shaped excessive solder never remains around the joint area 54 of the heatsink 20 when joint between the laser diode device 12 and the heatsink 20 is performed.

As in the second embodiment, it is possible to provide heatsink thin grooves contacting with the heatsink transverse groove 64.

Fifth Embodiment

Figure 11:
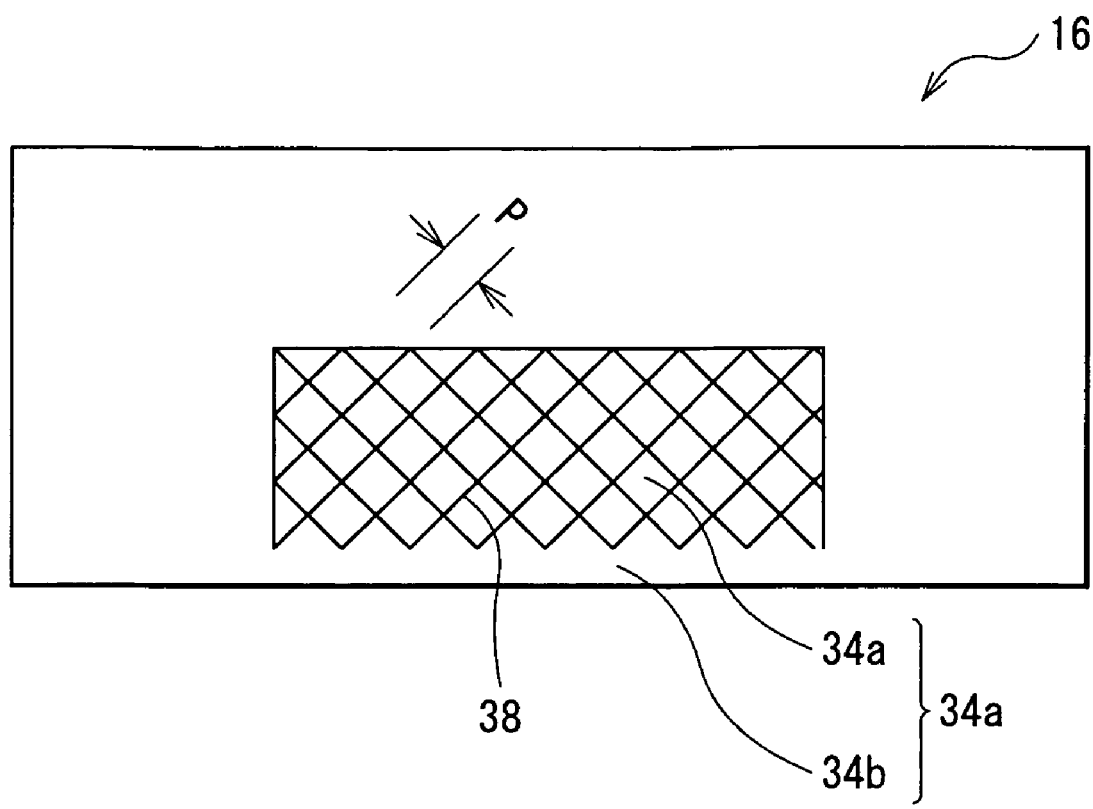
FIG. 11 is a plane view showing a construction of submount grooves of a laser diode assembly according to a fifth embodiment.

This embodiment relates to a laser diode assembly according to a fifth invention. FIG. 11 shows a construction of submount grooves thereof.

The laser diode assembly of this embodiment is the same as the laser diode assembly 30 of the first embodiment except that the construction of the submount grooves is different.

In this embodiment, differently from the first embodiment, as shown in FIG. 11, the submount 16 does not comprise the foregoing submount groove 32 and extension groove 36, but comprises several thin grooves in the joint area 34 jointed with the laser diode device 12 (refer to FIG. 1). In this embodiment, only the same thin grooves as the submount thin grooves 38 of the first embodiment are provided.

In this embodiment, since the submount 16 comprises the submount thin grooves 38, excessive solder flows into the submount thin grooves 38, and the submount thin grooves 38 function as a solder pool for the excessive solder when solder joint between the laser diode device 12 and the submount 16 is performed.

Therefore, when the laser diode device 12 and the submount 16 are jointed, bulb-shaped excessive solder never remains around the joint area 34 of the submount 16.

Sixth Embodiment

Figure 12:
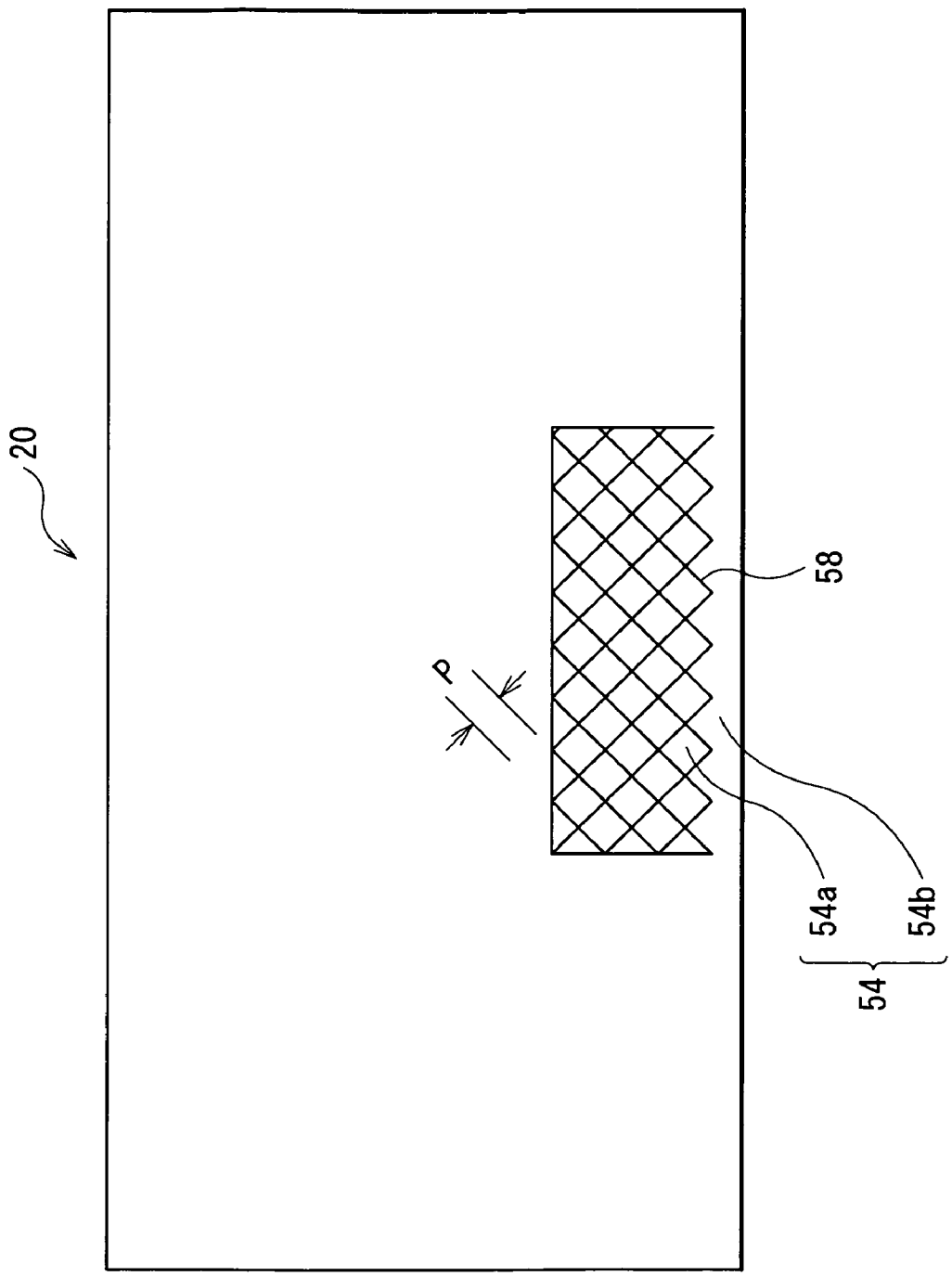
FIG. 12 is a plane view showing a construction of heatsink grooves of a laser diode assembly according to a sixth embodiment.
Figure 13:
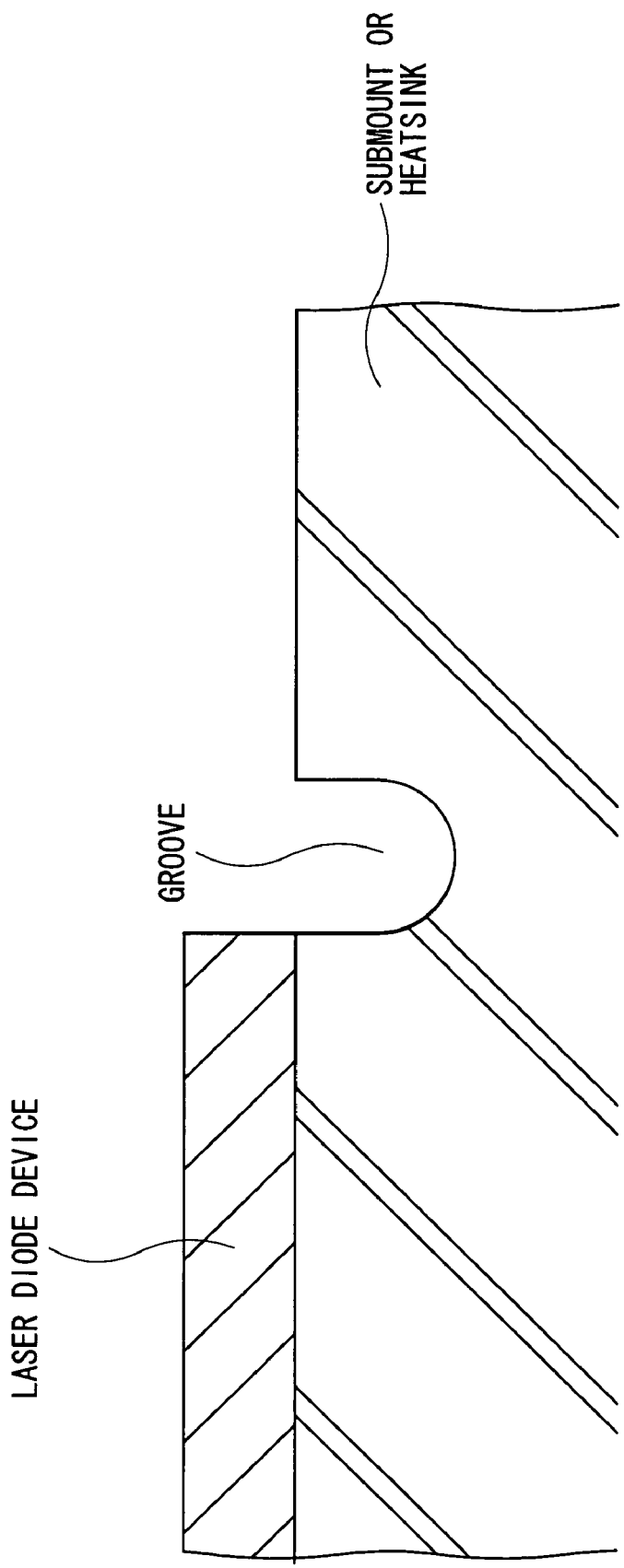
FIG. 13 is a cross sectional view to explain failure when a laser diode device and a submount are jointed.

This embodiment relates to a laser diode assembly according to the sixth invention. FIG. 12 shows a construction of heatsink grooves thereof.

The laser diode assembly of this embodiment is the same as the laser diode assembly 50 of the second embodiment except that the construction of the heatsink grooves is different.

In this embodiment, differently from the second embodiment, as shown in FIG. 12, the heatsink 20 does not comprise the second heatsink groove 52 and the extension groove 56, but comprises several thin grooves in the joint area 54 jointed with the laser diode device 12 (refer to FIG. 1). In this embodiment, only the same thin grooves as the heatsink thin grooves 58 of the second embodiment are provided.

In this embodiment, excessive solder flows into the heatsink thin grooves 58, and the heatsink thin grooves 58 function as a solder pool for the excessive solder when solder joint between the laser diode device 12 and the heatsink 20 is performed. Therefore, when the laser diode device 12 and the heatsink 20 are jointed, bulb-shaped excessive solder never remains around the joint area 54 of the heatsink 20.

Further, in the first to the sixth embodiments, it is possible that solder can be stably set while good flatness of the joint area 34 of the submount 16 and the joint area 54 of the heatsink 20 is maintained. Therefore, air entrance between solder and the joint area, or deterioration of contact characteristics between the joint area and solder can be prevented.

Seventh Embodiment

Figure 14:
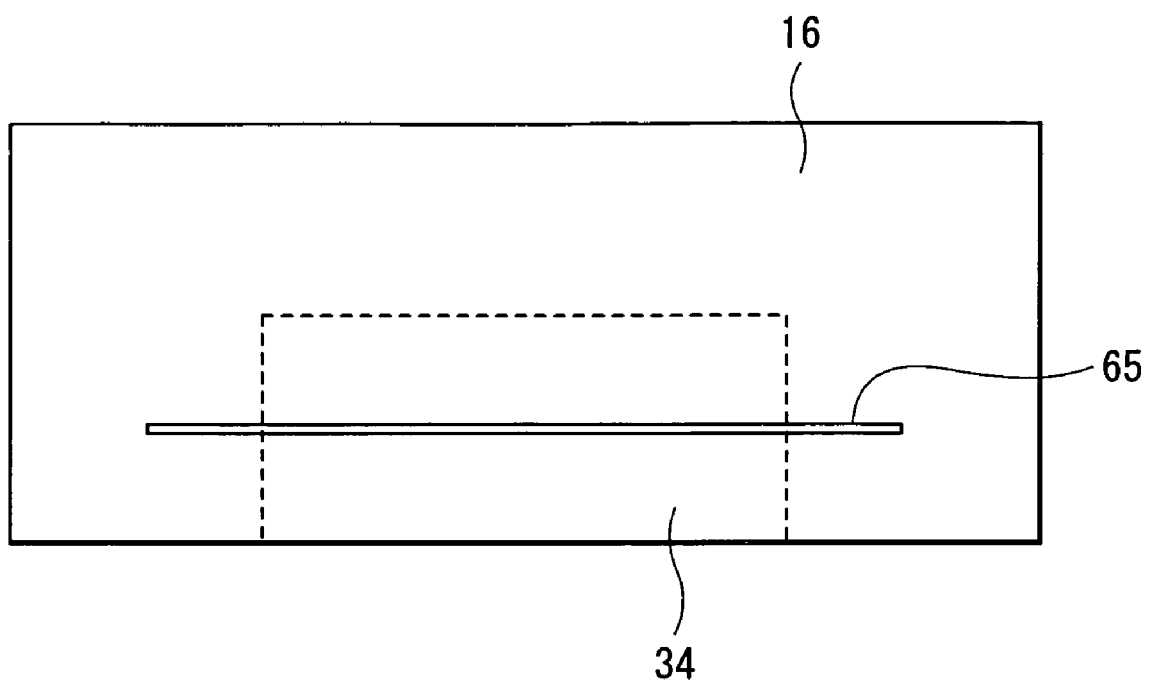
FIG. 14 is a plane view showing a construction of a submount groove of a laser diode assembly according to a seventh embodiment.

This embodiment relates to a laser diode assembly according to a seventh invention. FIG. 14 shows a construction of a submount transverse groove thereof.

The laser diode assembly of this embodiment has the same construction as of the laser diode assembly 30 of the first embodiment except that the groove construction of the submount 16 is different.

In this embodiment, the submount 16 comprises one submount transverse groove 65. The submount transverse groove 65 crosses the central part of the joint area 34 jointed with the laser diode device 12 (refer to FIG. 1), and extends in the direction parallel to the emitting end face of the laser diode device 12.

Differently from the submount transverse groove 62 of the third embodiment, the submount transverse groove 65 is closed at its both ends. As long as excessive solder melt can be pooled, it is not necessary to extend the submount transverse groove 65 to the edges of the submount 16 as the submount transverse groove 62 of the third embodiment.

Figure 15A:
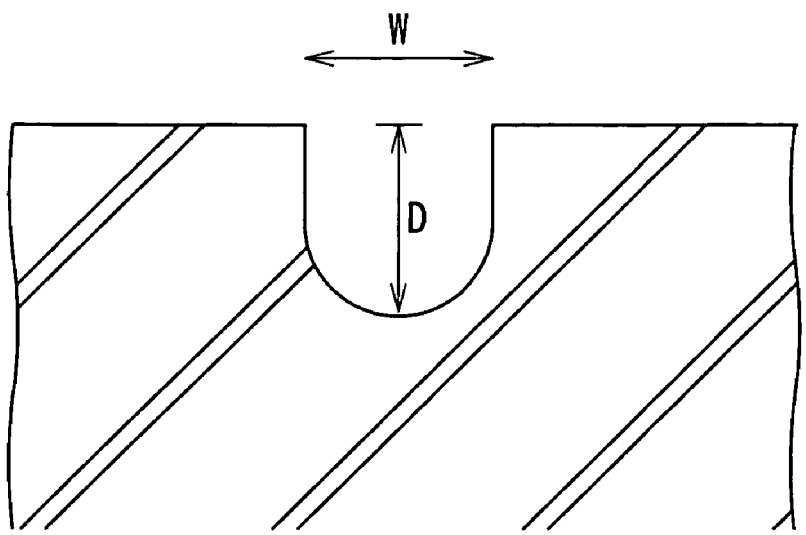
FIGS. 15A to 15C are cross sectional views showing shapes and sizes of respective grooves.
Figure 15B:
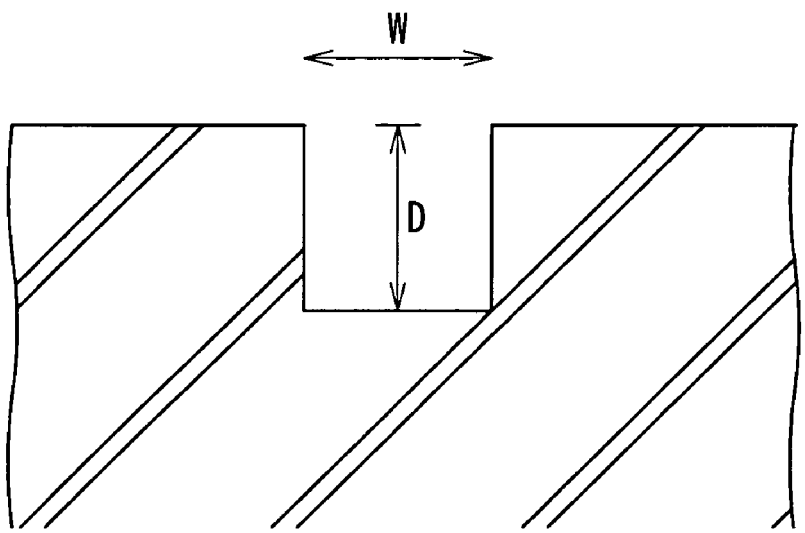

A shape of the submount transverse groove 65 is flexible. For example, the submount transverse groove 65 can be a U groove as shown in FIG. 15A. Further, as shown in FIG. 15B, a cross section of the submount transverse groove 65 can be rectangle. Furthermore, as shown in FIG. 15C, a cross section of the submount transverse groove 65 can be triangle.

Figure 15C:
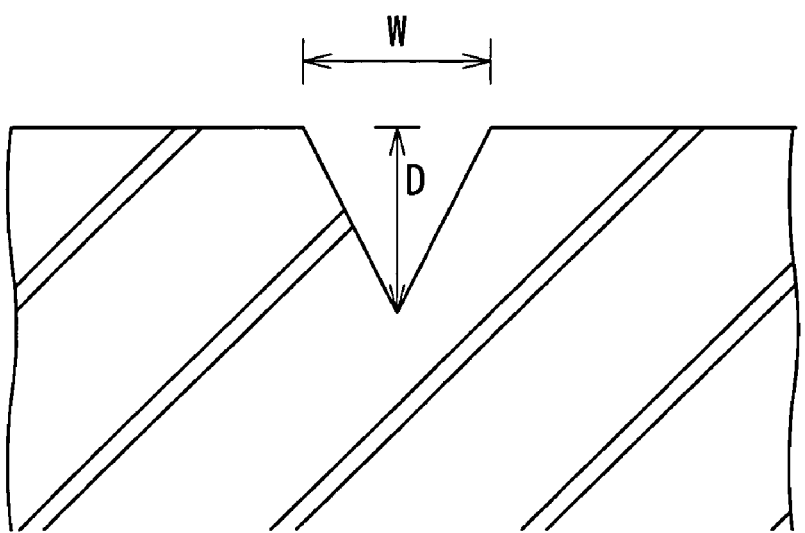

Regarding a size of the groove, each width W and depth D shown in FIGS. 15A to 15C is from 1 μm to 1 mm, and preferably from several dozen μm to 300 μm. In this embodiment, the submount transverse groove 65 is the U groove whose width W and depth D are 150 μm, respectively.

In this embodiment, when solder joint between the laser diode device 12 and the submount 16 is performed, excessive solder drains into the submount transverse groove 65 and flows inside the submount transverse groove 65 due to capillary thereof, and the submount transverse groove 65 functions as a solder pool for the excessive solder.

Therefore, also in this embodiment, when the laser diode device 12 and the submount 16 are jointed, bulb-shaped excessive solder never remains around the joint area 34 of the submount 16.

Eighth Embodiment

Figure 16:
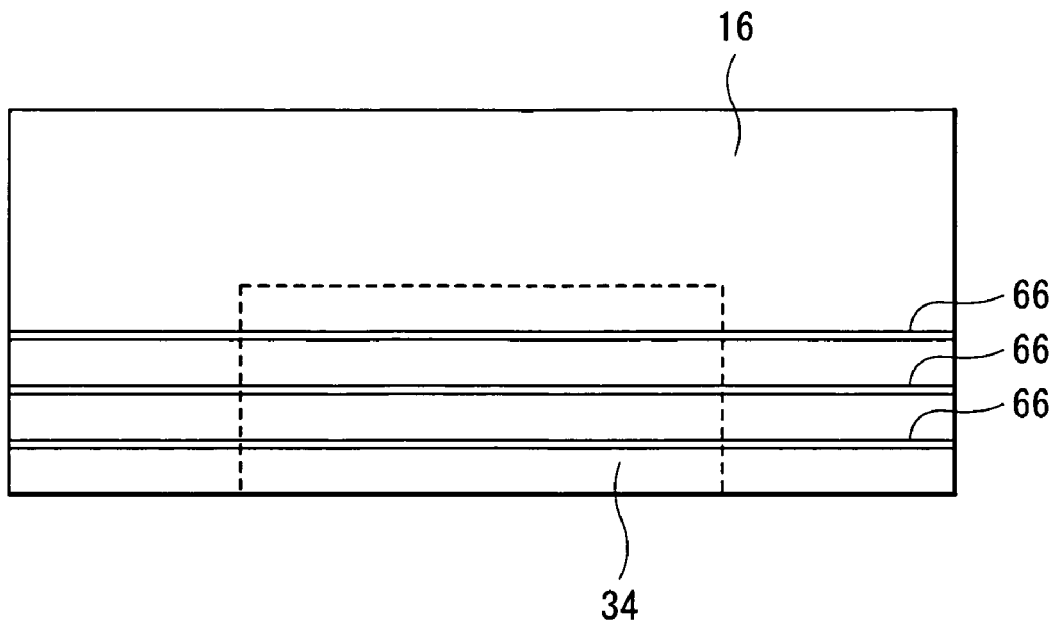
FIG. 16 is a plane view showing a construction of submount grooves of a laser diode assembly according to an eighth embodiment.

This embodiment relates to a laser diode assembly according to the seventh invention. FIG. 16 shows a construction of submount transverse grooves thereof.

The laser diode assembly of this embodiment has the same construction as of the laser diode assembly 30 of the first embodiment except that the groove construction of the submount 16 is different.

In this embodiment, the submount 16 has several (three in this embodiment) submount transverse grooves 66. The submount transverse grooves 66 cross the central part of the joint area 34 jointed with the laser diode device 12 (refer to FIG. 1), and cross from one edge to the other facing edge of the submount 16 in the direction parallel to the emitting end face of the laser diode device 12.

An arrangement pitch of the submount transverse grooves 66 is about 1 mm. A shape and a size of the submount transverse groove 66 are the same as of the submount transverse groove 65 of the seventh embodiment. The pitch varies depending on solder amounts. When the pitch is small, it becomes difficult to maintain flatness in the process. The pitch is basically approximately from several hundred μm to 2 mm. These figures will be applied to the following embodiments.

In this embodiment, when solder joint between the laser diode device 12 and the submount 16 is performed, excessive solder drains into the submount transverse grooves 66 and flows inside the submount transverse grooves 66 due to capillary phenomenon thereof, the submount transverse grooves 66 function as a solder pool for the excessive solder, and the excessive solder is drained outside.

Therefore, also in this embodiment, when the laser diode device 12 and the submount 16 are jointed, bulb-shaped excessive solder never remains around the joint area 34 of the submount 16.

Ninth Embodiment

Figure 17:
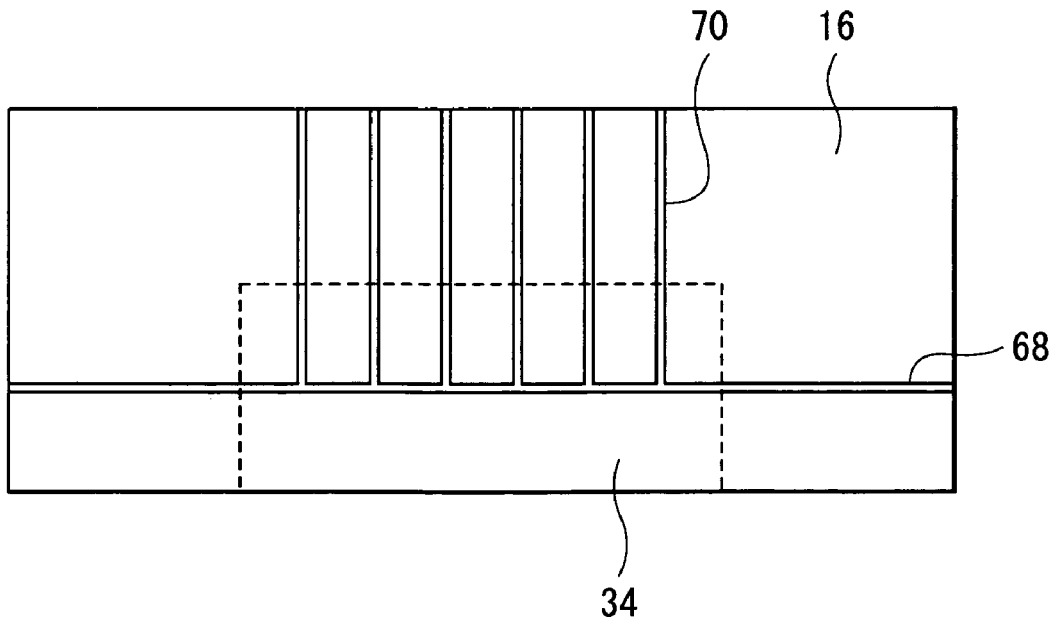
FIG. 17 is a plane view showing a construction of submount grooves of a laser diode assembly according to a ninth embodiment.

This embodiment relates to other example of a laser diode assembly according to the seventh invention. FIG. 17 shows a construction of a submount transverse groove thereof.

The laser diode assembly of this embodiment has the same construction as of the laser diode assembly 30 of the first embodiment except that the groove construction of the submount 16 is different.

In this embodiment, the submount 16 has one submount transverse groove 68. The submount transverse groove 68 crosses the central part of the joint area 34 jointed with the laser diode device 12 (refer to FIG. 1), and extends from one edge to the other facing edge of the submount 16 in the direction parallel to the emitting end face of the laser diode device 12.

Further, the submount 16 has several submount branch grooves 70. One ends of the submount branch grooves 70 contact with the submount transverse groove 68, and the other ends of the submount branch grooves 70 extend to the edge opposite of the emitting end face side of the laser diode device 12 in the direction perpendicular to the submount transverse groove 68.

An arrangement pitch of the submount branch grooves 70 is about 1 mm. A shape and a size of the submount transverse groove 68 and the submount branch groove 70 are the same as of the submount transverse groove 65 of the seventh embodiment.

In this embodiment, the submount branch grooves 70 are provided in addition to the submount transverse groove 68. Therefore, when solder joint between the laser diode device 12 and the submount 16 is performed, excessive solder flows from the submount transverse groove 68 into the submount branch grooves 70, the excessive solder flows in the submount transverse groove 68 and the submount branch grooves 70 due to capillary phenomenon in the submount transverse groove 68 and the submount branch grooves 70, the submount transverse groove 68 and the submount branch grooves 70 function as a solder pool for the excessive solder, and the excessive solder is drained outside through the submount branch grooves 70.

Therefore, also in this embodiment, when the laser diode device 12 and the submount 16 are jointed, bulb-shaped excessive solder never remains around the joint area 34 of the submount 16.

Figure 18:
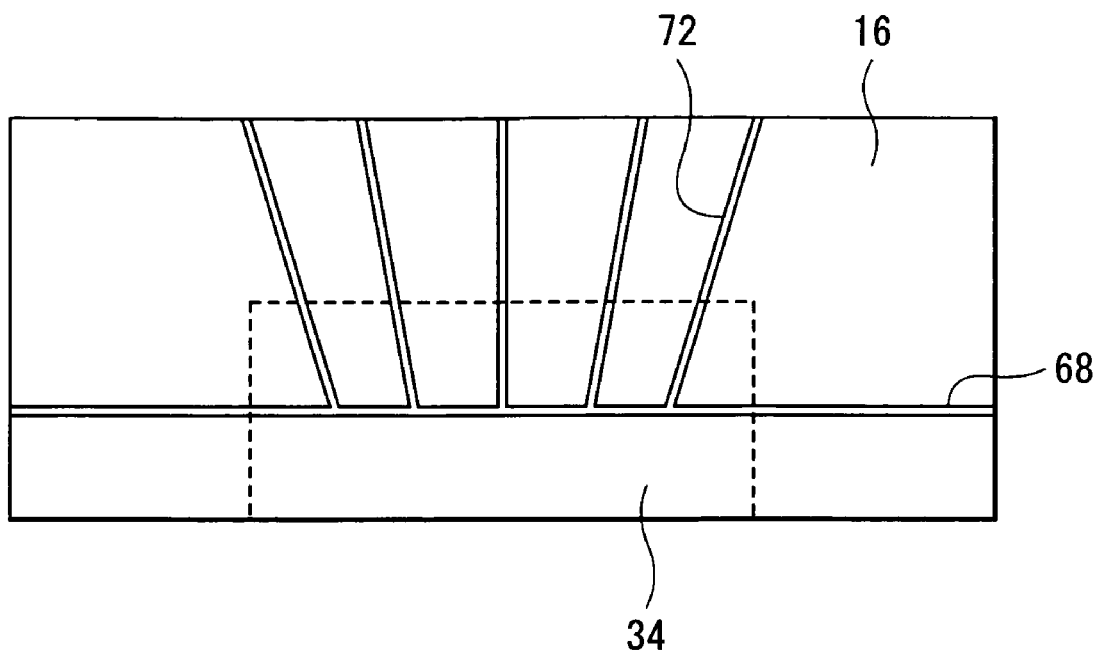
FIG. 18 is a plane view showing a construction of submount grooves of a laser diode assembly according to a modification of the ninth embodiment.

In this embodiment, the submount branch grooves 70 extend in the direction perpendicular to the submount transverse groove 68. However, it is not indispensable that the extending direction is in the direction perpendicular to the submount transverse groove 68. For example, as shown in FIG. 18, submount branch grooves 72 can extend to the edge opposite of the emitting end face side in the fan-like shape.

Figure 19:
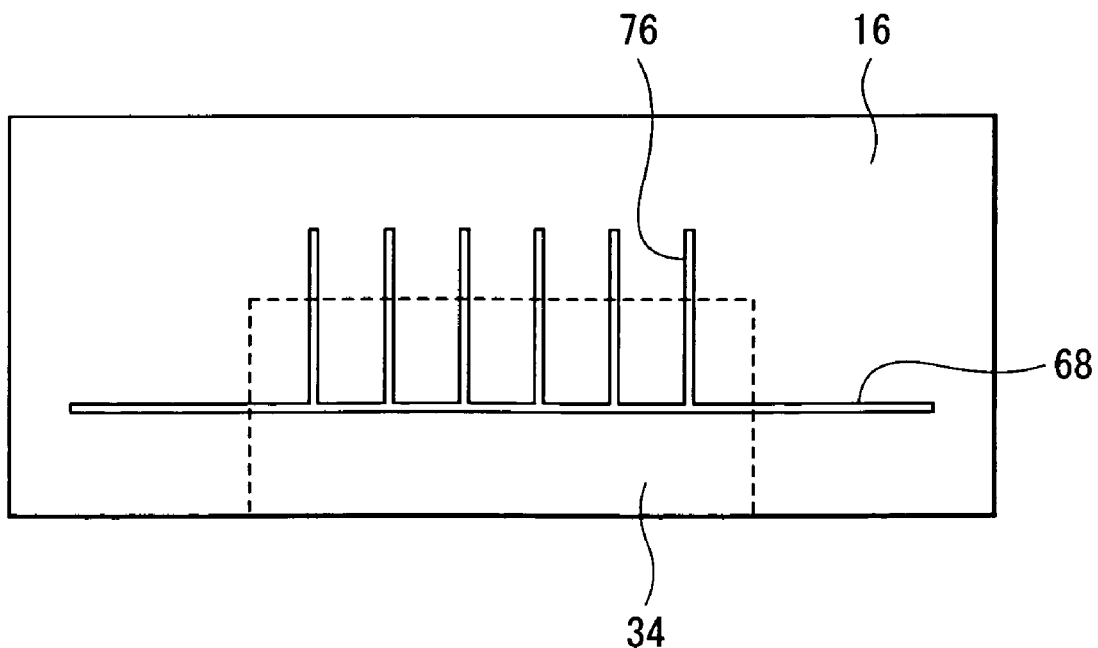
FIG. 19 is a plane view showing a construction of submount grooves of a laser diode assembly according to other modification of the ninth embodiment.

Further, in this embodiment, the submount transverse groove 68 extends from one submount face to the other facing submount face. However, as long as the submount transverse groove has an enough groove capacity as a solder pool for the excessive solder, as shown in FIG. 19, both ends of the submount transverse groove 68 can be closed. Furthermore, only one end of the submount transverse groove can be closed.

Further, in this embodiment, one ends of the submount branch grooves 70 extend to the edge opposite of the emitting end face side of the laser diode device in the direction perpendicular to the transverse groove 68. However, as long as the submount branch grooves have enough groove capacities as a solder pool for the excessive solder, as shown in FIG. 19, the other ends can be closed.

Tenth Embodiment

Figure 20:
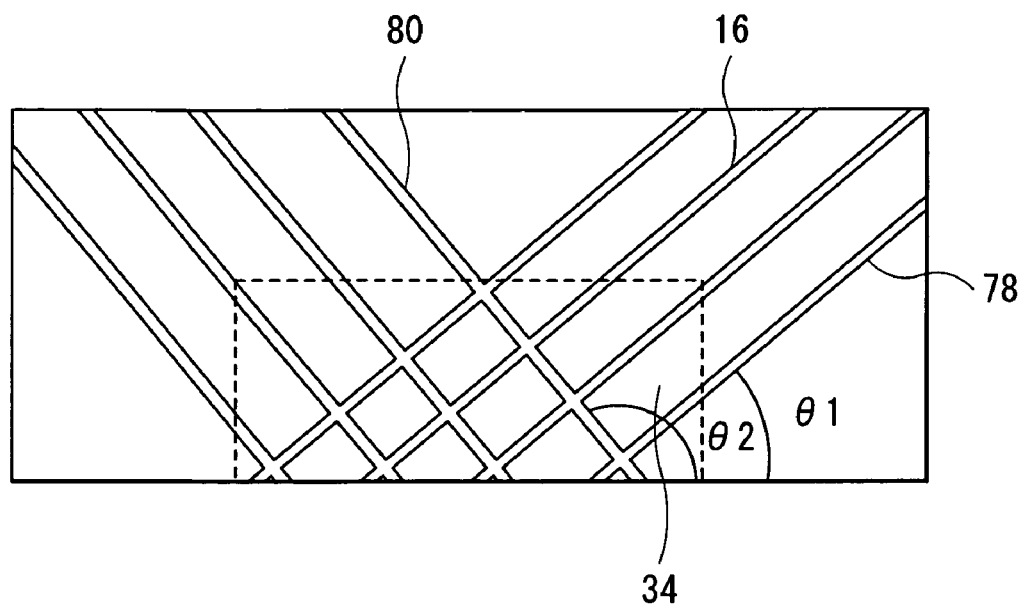
FIG. 20 is a plane view showing a construction of submount grooves of a laser diode assembly according to a tenth embodiment.

This embodiment relates to a laser diode assembly according to the seventh invention. FIG. 20 shows a construction of submount transverse grooves thereof. The laser diode assembly of this embodiment has the same construction as of the laser diode assembly 30 of the first embodiment except that the groove construction of the submount 16 is different.

In this embodiment, the submount 16 has several first submount cross grooves 78 and second submount cross grooves 80. The first submount cross grooves 78 cross the joint area 34 jointed with the laser diode device 12 (refer to FIG. 1) at a crossing angle $\theta_1$ of 40° in relation to an edge of the submount 16 on the emitting end face side of the laser diode device 12. Similarly, the second submount cross grooves 80 cross the joint area 34 at a crossing angle $\theta_2$ of 140°. Regarding the crossing angle $\theta_2$, its clockwise crossing angle is 40°.

An arrangement pitch of the first submount cross grooves 78 and the second submount cross grooves 80 is about 1 mm. A shape and a size thereof are the same as of the submount transverse groove 65 of the seventh embodiment.

In this embodiment, the first submount cross grooves 78 and the second submount cross grooves 80 are provided. Therefore, when solder joint between the laser diode device 12 and the submount 16 is performed, excessive solder flows into these grooves, the excessive solder flows in these grooves due to capillary phenomenon in these grooves, these grooves function as a solder pool for the excessive solder, and the excessive solder is drained outside.

Therefore, when the laser diode device 12 and the submount 16 are jointed, bulb-shaped excessive solder never remains around the joint area 34 of the submount 16.

In this embodiment, the first submount cross grooves 78 and the second submount cross grooves 80 extend to the submount face on the emitting end face side of the laser diode device 12. However, the crossing angles $\theta_1$ and $\theta_2$ are respectively in the angle range specified in the invention. Therefore, solder melt never flows to the submount face on the emitting end face side.

Further, the crossing angles $\theta_1$ and $\theta_2$ are flexible as long as they are 45° or less in relation to the submount face on the emitting end face side.

Figure 21:
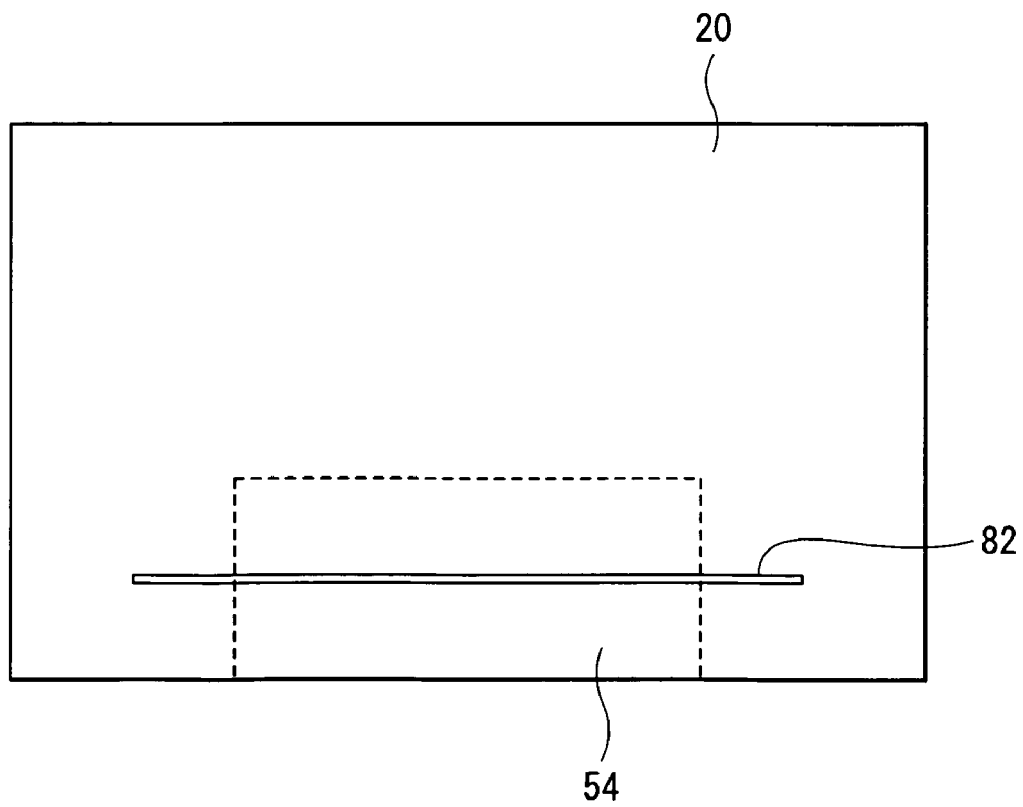
FIG. 21 is a plane view showing a construction of a heatsink groove of a laser diode assembly according to an eleventh embodiment.

In the foregoing embodiments 7 to 10, descriptions have been given of the groove construction in the joint area of the submount 16 taking solder joint between the laser diode device 12 and the submount 16 as an example. Similarly, when joint between the submount 16 and the heatsink 20 is performed, by providing a heatsink transverse groove (not shown) or the like having the same construction as of the foregoing submount transverse groove 65 and the like in the joint area between the heatsink 20 and the submount 16, bulb-shaped excessive solder never remains around the joint area when solder joint between the submount 16 and the heatsink 20 is performed Eleventh Embodiment This embodiment relates to a laser diode assembly according to an eighth invention. FIG. 21 shows a construction of a heatsink groove thereof.

The laser diode assembly of this embodiment has the same construction as of the laser diode assembly 50 of the second embodiment except that the groove construction of the heatsink 20 is different.

In this embodiment, the heatsink 20 has one heatsink transverse groove 82. The heatsink transverse groove 82 crosses the central part of the joint area 54 jointed with the laser diode device 12 (refer to FIG. 1), and extends in the direction parallel to the emitting end face of the laser diode device 12. Differently from the heatsink transverse groove 64 of the fourth embodiment, this heatsink transverse groove 82 is closed at its both ends. As long as excessive solder melt can be pooled, it is not necessary to extend the heatsink transverse groove to the edges of the heatsink 20 as the heatsink transverse groove 64 of the fourth embodiment.

In this embodiment, when solder joint between the laser diode device 12 and the heatsink 20 is performed, excessive solder drains into the heatsink transverse groove 82 and flows inside the heatsink transverse groove 82 due to capillary phenomenon thereof, and the heatsink transverse groove 82 functions as a solder pool for the excessive solder. Therefore, when the laser diode device 12 and the heatsink 20 are jointed, bulb-shaped excessive solder never remains around the joint area 54 of the heatsink 20.

Twelfth Embodiment

Figure 22:
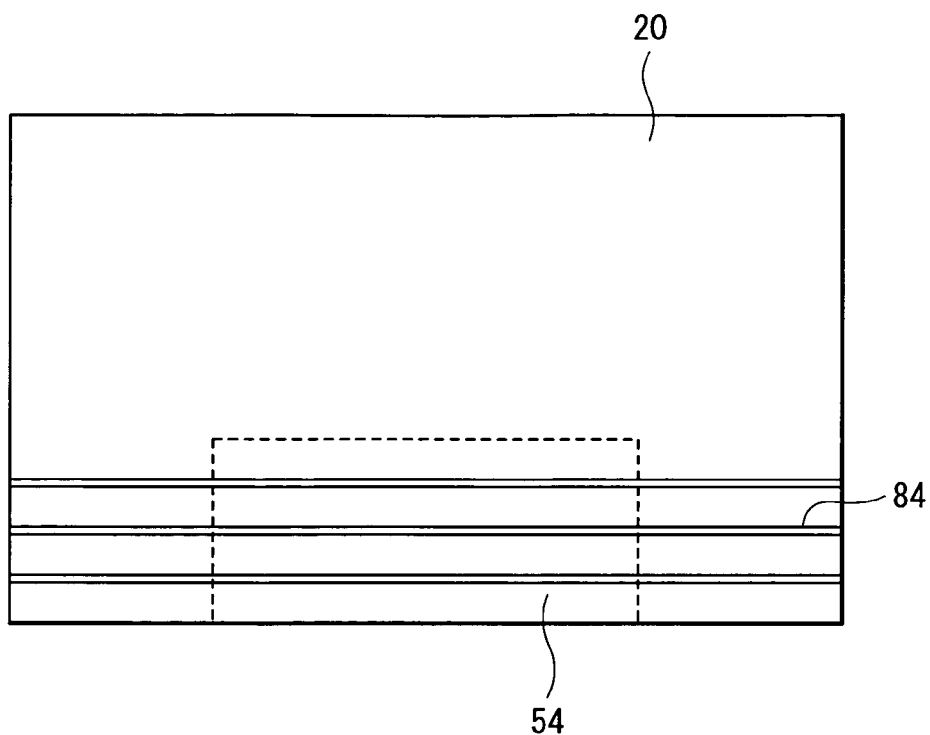
FIG. 22 is a plane view showing a construction of heatsink grooves of a laser diode assembly according to a twelfth embodiment.

This embodiment relates to a laser diode assembly according to the eighth invention. FIG. 22 shows a construction of heatsink transverse grooves thereof.

The laser diode assembly of this embodiment has the same construction as of the laser diode assembly 50 of the second embodiment except that the groove construction of the heatsink 20 is different.

In this embodiment, the heatsink 20 has several (three in this embodiment) heatsink transverse grooves 84. The heatsink transverse grooves 84 cross the central part of the joint area 54 jointed with the laser diode device 12 (refer to FIG. 1) from one edge to the other facing edge of the heatsink 20 in the direction parallel to the emitting end face of the laser diode device 12.

An arrangement pitch of the heatsink transverse grooves 84 is about 1 mm. A shape and a size of the heatsink transverse groove 84 are the same as of the submount transverse groove 65 of the seventh embodiment.

In this embodiment, when solder joint between the laser diode device 12 and the heatsink 20 is performed, excessive solder drains into the heatsink transverse grooves 84 and flows inside the heatsink transverse grooves 84 due to capillary phenomenon, the heatsink transverse grooves 84 function as a solder pool for the excessive solder, and the excessive solder is drained outside.

Therefore, when the laser diode device 12 and the heatsink 20 are jointed, bulb-shaped excessive solder never remains around the joint area 54 of the heatsink 20.

Thirteenth Embodiment

Figure 23:
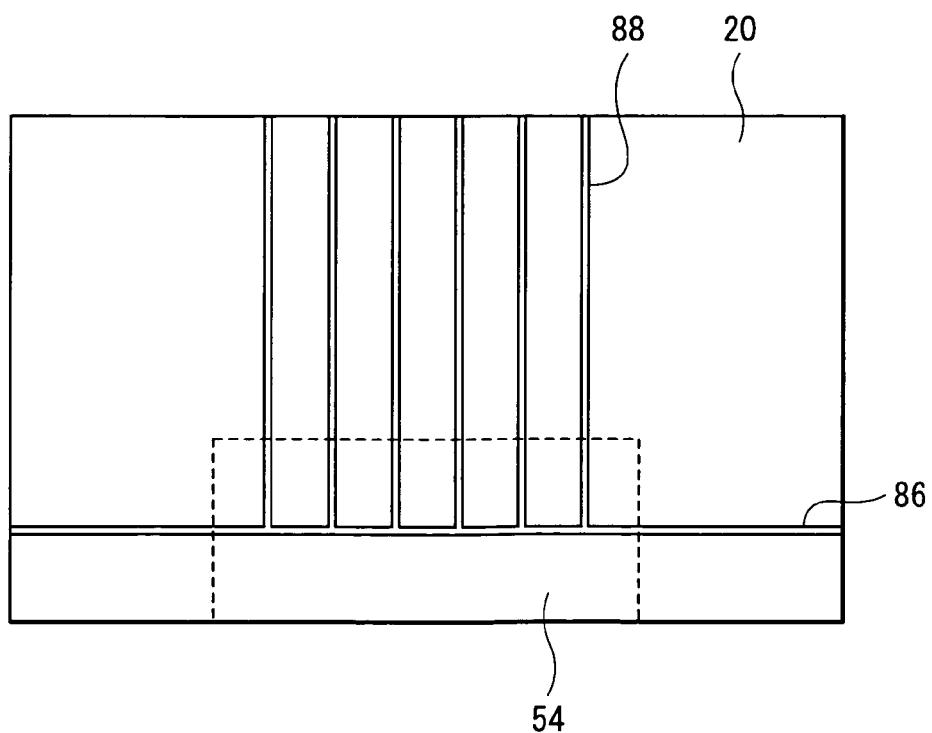
FIG. 23 is a plane view showing a construction of heatsink grooves of a laser diode assembly according to a thirteenth embodiment.

This embodiment is still other example of a laser diode assembly according to the eighth invention. FIG. 23 shows a construction of a heatsink transverse groove thereof.

The laser diode assembly of this embodiment has the same construction as of the laser diode assembly 50 of the second embodiment except that the groove construction of the heatsink 20 is different.

In this embodiment, the heatsink 20 has one heatsink transverse groove 86. The heatsink transverse groove 86 crosses the central part of the joint area 54 jointed with the laser diode device 12 (refer to FIG. 1), and extends from one edge to the other facing edge of the heatsink 20 in the direction parallel to the emitting end face of the laser diode device 12.

Further, the heatsink 20 comprises several heatsink branch grooves 88. One ends of the heatsink branch grooves 88 contact with the heatsink transverse groove 86, and the other ends of the heatsink branch grooves 88 extend to the edge opposite of the emitting end face side of the laser diode device in the direction perpendicular to the heatsink transverse groove 86.

An arrangement pitch of the heatsink branch grooves 88 is about 1 mm. A shape and a size of the heatsink transverse groove 86 and the heatsink branch groove 88 is the same as of the submount transverse groove 65 of the seventh embodiment.

In this embodiment, when solder joint between the laser diode device 12 and the heatsink 20 is performed, excessive solder drains from the heatsink transverse groove 86 into the heatsink branch grooves 88 and flows in the heatsink transverse groove 86 and the heatsink branch grooves 88 due to capillary phenomenon, the heatsink transverse groove 86 and the heatsink branch grooves 88 function as a solder pool for the excessive solder, and the excessive solder is drained outside.

Therefore, when the laser diode device 12 and the heatsink 20 are jointed, bulb-shaped excessive solder never remains around the joint area 54 of the heatsink 20.

Figure 24:
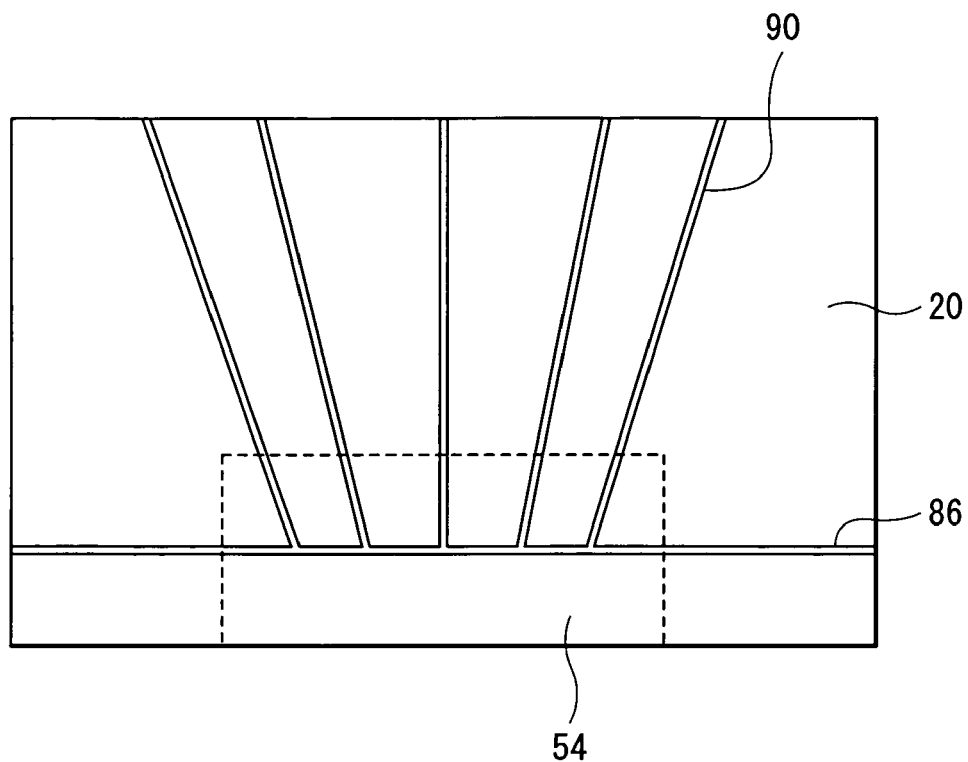
FIG. 24 is a plane view showing a construction of heatsink grooves of a laser diode assembly according to a modification of the thirteenth embodiment.

In the thirteenth embodiment, the heatsink branch grooves 88 extend in the direction perpendicular to the heatsink transverse groove 86. However, it is not indispensable that the extending direction is in the direction perpendicular to the heatsink transverse groove 86. For example, as shown in FIG. 24, heatsink branch grooves 90 can extend to the edge opposite of the emitting end face side in the fan-like shape.

Figure 25:
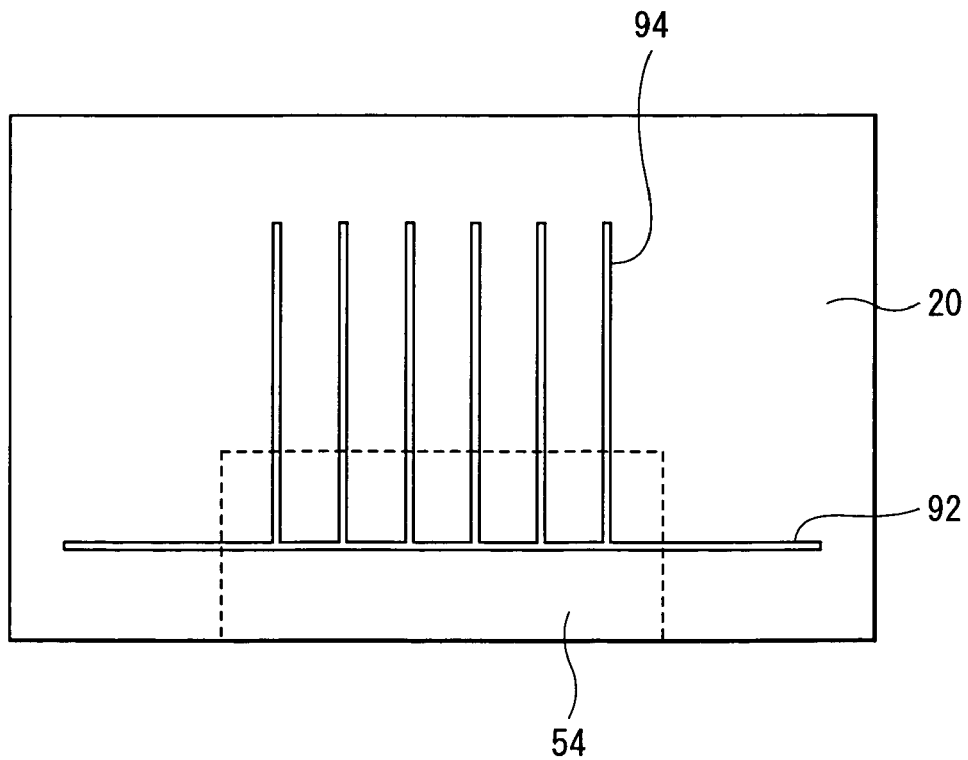
FIG. 25 is a plane view showing a construction of heatsink grooves of a laser diode assembly according to other modification of the thirteenth embodiment.

Further, in the thirteenth embodiment, the heatsink transverse groove 86 extends from one heatsink face to the other facing heatsink face. However, as long as the heatsink transverse groove has an enough groove capacity as a solder pool for the excessive solder, as shown in FIG. 25, both ends of a heatsink transverse groove 92 can be closed. Furthermore, only one end of the heatsink transverse groove can be closed.

Further, in the thirteenth embodiment, other ends of the heatsink branch grooves 88 extend to the edge opposite of the emitting end face side of the laser diode device in the direction perpendicular to the heatsink transverse groove 86. However, as long as the heatsink branch grooves have enough groove capacities as a solder pool for the excessive solder, as shown in FIG. 25, the other ends of heatsink branch grooves 94 can be closed.

Fourteenth Embodiment

Figure 26:
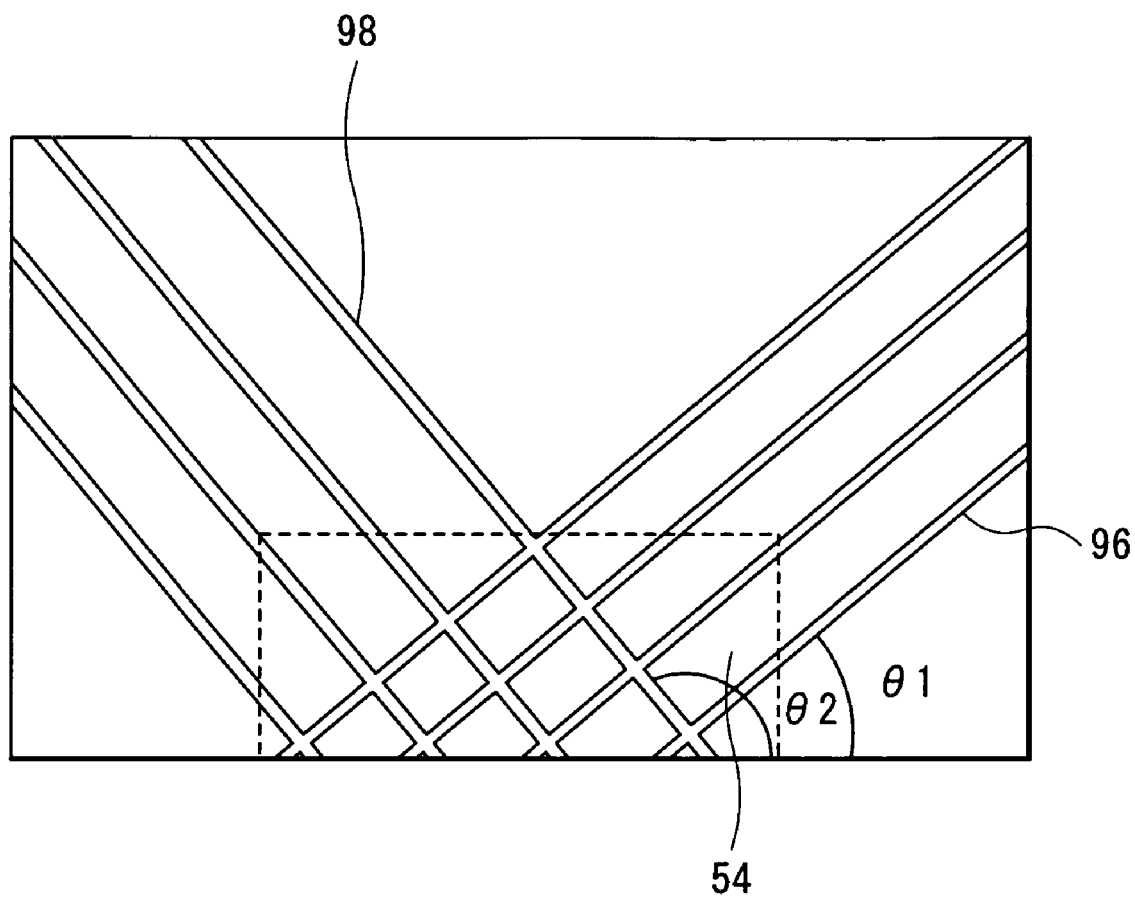
FIG. 26 is a plane view showing a construction of heatsink grooves of a laser diode assembly according to a fourteenth embodiment.

This embodiment is still other example of a laser diode assembly according to the eighth invention. FIG. 26 shows a construction of heatsink transverse grooves thereof.

The laser diode assembly of this embodiment is the same as the laser diode assembly 50 of the second embodiment except that the groove construction of the heatsink 20 is different.

In this embodiment, the heatsink 20 has several first heatsink cross grooves 96 and several second heatsink cross grooves 98. The first heatsink cross grooves 96 cross the joint area 54 jointed with the laser diode device 12 (refer to FIG. 1) at a crossing angle $\theta_1$ of 40° in relation to an edge of the heatsink 20 on the emitting end face side of the laser diode device 12. Similarly, the second heatsink cross grooves 98 cross the joint area 54 at a crossing angle $\theta_2$ of 140°.

An arrangement pitch of the first heatsink cross grooves 96 and the second heatsink cross grooves 98 is about 1 mm. A shape and a size thereof are the same as of the submount transverse groove 65 of the seventh embodiment.

In this embodiment, when solder joint between the laser diode device 12 and the heatsink 20 is performed, excessive solder drains into the first heatsink cross grooves 96 and the second heatsink cross grooves 98 and flows in the first heatsink cross grooves 96 and the second heatsink cross grooves 98 due to capillary phenomenon thereof, these grooves function as a solder pool for the excessive solder, and the excessive solder is drained outside.

Therefore, when the laser diode device 12 and the heatsink 20 are jointed, bulb-shaped excessive solder never remains around the joint area 54 of the heatsink 20.

In this embodiment, the first heatsink cross grooves 96 and the second heatsink cross grooves 98 extend to the heatsink face on the emitting end face side of the laser diode device 12. However, the crossing angles $\theta_1$ and $\theta_2$ are respectively in the angle range specified in the invention. Therefore, solder melt never flows to the heatsink face on the emitting end face side.

Further, the crossing angles $\theta_1$ and $\theta_2$ are flexible as long as they are 45° or less in relation to the heatsink face on the emitting end face side.

Method of Manufacturing a Laser Diode Assembly

This embodiment relates to a method of manufacturing a laser diode assembly according to a ninth invention. This embodiment is applied to manufacturing the laser diode assembly of the seventh embodiment.

In this embodiment, when the laser diode device 12 is jointed to the submount 16, the submount 16 which holds the laser diode device 12 on the joint area 34 of the submount 16 is forwarded in a reflow oven, and solder on the joint area 34 of the submount 16 is melted.

Next, excessive solder out of the melted solder is drained out between the submount 16 and the laser diode device 12, flown and pooled in the submount transverse groove 65 due to capillary phenomenon arising in the submount transverse groove 65 (refer to FIG. 14) which crosses the joint area 34 of the submount 16.

Next, after a temperature in the reflow oven is lowered and the solder melt is solidified, the submount 16 on which the laser diode 12 is fixed is taken out of the reflow oven.

Next, a process wherein the submount 16 is jointed to the heatsink 20 will be performed. The heatsink 20 which holds the submount 16 on the joint area 54 of the heatsink 20 is forwarded in the reflow oven, and solder on the joint area 54 of the heatsink 20 is melted. Excessive solder out of the melted solder is drained out between the heatsink 20 and the submount 16, flown and pooled in the heatsink transverse groove due to capillary phenomenon arising in the heatsink transverse groove which crosses the joint area 54 of the heatsink 20.

In this embodiment, excessive solder out of the melted solder is drained out between the submount 16 and the laser diode device 12, flown and pooled in the submount transverse groove 65 due to capillary phenomenon arising in the submount transverse groove 65. Therefore, when solder joint between the laser diode device 12 and the submount 16 is performed, bulb-shaped excessive solder never remains around the joint area 34 between the laser diode device 12 and the submount 16.

Similarly, excessive solder out of the melted solder is drained out between the submount 16 and the heatsink 20, flown and pooled inside the heatsink transverse groove due to capillary phenomenon arising in the heatsink transverse groove. Therefore, when solder joint between the submount 16 and the heatsink 20 is performed, bulb-shaped excessive solder never remains around the joint area between the submount 16 and the heatsink 20.

In this embodiment, after the laser diode device 12 is jointed to the submount 16, the submount 16 is jointed to the heatsink 20. However, it is possible that joint between the laser diode device 12 and the submount 16 and joint between the submount 16 and the heatsink 20 can be concurrently performed in the reflow oven.

A method of manufacturing the laser diode assembly according to the tenth invention can be performed in a manner similar to in this embodiment basically.

As described above, in the first invention, when solder joint between the laser diode device and the submount is performed, the submount groove is provided; and in the second invention, when solder joint between the laser diode device and the heatsink is performed, the second heatsink groove is provided. Excessive solder is thereby drained out into the submount groove or the second heatsink groove, the submount groove or the second heatsink groove functions as a solder pool for the excessive solder, and the excessive solder is drained outside. Therefore, bulb-shaped excessive solder never remains around the joint area between the laser diode device and the submount, and the joint area between the laser diode device and the heatsink.

Further, in the first and the second inventions, it is possible that solder is stably set while good flatness of the joint area is maintained. Therefore, air entrance between solder and the joint area, or deterioration of contact characteristics between the joint area and solder can be prevented.

In the third invention, when solder joint between the laser diode device and the submount is performed, the submount transverse groove is provided. In the fourth invention, when solder joint between the laser diode device and the heatsink is performed, the heatsink transverse groove is provided. Excessive solder is thereby drained out into the submount transverse groove or the heatsink transverse groove, the submount transverse groove or the heatsink transverse groove functions as a solder pool for the excessive solder, and the excessive solder is drained outside. Therefore, bulb-shaped excessive solder never remains around the joint area between the laser diode device and the submount and the joint area between the laser diode device and the heatsink.

Further, in the third and the fourth inventions, it is possible that solder is stably set while good flatness of the joint area is maintained. Therefore, air entrance between solder and the joint area, or deterioration of contact characteristics between the joint area and solder can be prevented.

Next, in the fifth invention, when solder joint between the laser diode device and the submount is performed, the thin grooves are provided on the joint area of the submount. In the sixth invention, when solder joint between the laser diode device and the heatsink is performed, the thin grooves are provided on the joint area of the heatsink. Excessive solder is thereby drained out into the thin grooves, and the thin grooves function as a solder pool for the excessive solder. Therefore, bulb-shaped excessive solder never remains around the joint area between the laser diode device and the submount, and the joint area between the laser diode device and the heatsink.

Further, in the fifth and the sixth inventions, it is possible that solder is stably set while good flatness of the joint area is maintained. Therefore, air entrance between solder and the joint area, or deterioration of contact characteristics between the joint area and solder can be prevented.

Further, in the seventh invention, when solder joint between the laser diode device and the submount is performed, the various modes of the submount transverse groove (or submount cross groove) are provided. In the eighth invention, when solder joint between the laser diode device and the heatsink is performed, the various modes of the heatsink transverse groove (or heatsink cross groove) are provided. Excessive solder is thereby drained out into the submount transverse groove or the heatsink transverse groove, the submount transverse groove or the heatsink transverse groove functions as a solder pool for the excessive solder, and the excessive solder is drained outside due to capillary phenomenon in the submount transverse groove or the heatsink transverse groove.

Therefore, bulb-shaped excessive solder never remains around the joint area between the laser diode device and the submount, and the joint area between the laser diode device and the heatsink.

The invention claimed is:

1. A laser diode assembly comprising:
a laser diode device;
a submount jointed on a substrate side of the laser diode device with a first solder layer in between; and
a heatsink jointed on a rear face side of the submount with a second solder layer in between,
wherein the submount has a submount groove at least at a part of a periphery of a joint area along a border of the joint area jointed with the laser diode device, the submount groove having continuous uninterrupted sidewalls,
wherein the submount groove is formed along a border of the joint area of the submount on a rear end face side opposite of an emitting end face of the laser diode device and a border of the joint area of the submount on both side wall sides of the laser diode device,
wherein several submount thin grooves whose width is smaller and depth is shallower than that of the submount groove are formed on the joint area of the submount so that the submount thin grooves are spaced from each other, and at least one ends of the submount thin grooves contact with the submount groove,
wherein the submount thin grooves extend in the direction diagonally to the submount groove, or in the direction parallel to border of the joint area on the rear end face side of the laser diode device, and
wherein outlets of the submount groove and outlets of the submount thin grooves, which correspond to the emitting end face side of the laser diode device, are closed.

2. A laser diode assembly according to claim 1, wherein the heatsink has a heatsink groove at a periphery of a joint area along border of the joint area jointed with the submount.

3. A laser diode assembly according to claim 1, wherein an extension groove of the submount groove extends to edges of the submount.

4. A laser diode assembly comprising: a laser diode device; a submount jointed on a substrate side of the laser diode device with a first solder layer in between; and a heatsink jointed on a rear face side of the submount with a second solder layer in between,
wherein the submount has a submount transverse groove which crosses a joint area jointed with the laser diode device, and reaches edges of the submount, the submount transverse groove having continuous uninterrupted sidewalls,
wherein several submount thin grooves whose width is smaller and depth is shallower than that of the submount transverse groove are formed on the joint area of the submount so that the submount thin grooves are spaced from each other, and at least one ends of the submount thin grooves contact with the submount transverse groove,
wherein the submount thin grooves extend in the direction diagonally to the submount transverse groove, or in the direction parallel to border of the joint area on the rear end face side of the laser diode device, and
wherein outlets of the submount transverse groove and outlets of the submount thin grooves, which correspond to the emitting end face side of the laser diode device, are closed.

5. A laser diode assembly according to claim 4, wherein the submount transverse groove crosses approximately the center of the joint area in the direction parallel to an emitting end face of the laser diode device.

6. A laser diode assembly comprising: a laser diode device; a submount jointed on a substrate side of the laser diode device with a first solder layer in between; and a heatsink jointed on a rear face side of the submount with a second solder layer in between,
wherein the submount has several thin grooves in a joint area jointed with the laser diode device,
wherein the submount thin grooves extend in the direction diagonally to thin grooves along a periphery of the joint area, and
wherein outlets of the thin grooves and outlets of the submount thin grooves, which correspond to the emitting end face side of the laser diode device, are closed.

* * * * *